(12) United States Patent
Fiorenza et al.

(10) Patent No.: US 8,344,242 B2
(45) Date of Patent: Jan. 1, 2013

(54) MULTI-JUNCTION SOLAR CELLS

(75) Inventors: James Fiorenza, Wilmington, MA (US); Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1026 days.

(21) Appl. No.: 12/147,027

(22) Filed: Jun. 26, 2008

(65) Prior Publication Data

US 2009/0065047 A1 Mar. 12, 2009

Related U.S. Application Data

(60) Provisional application No. 60/970,808, filed on Sep. 7, 2007, provisional application No. 60/980,103, filed on Oct. 15, 2007.

(51) Int. Cl.
*H01L 31/00* (2006.01)
(52) U.S. Cl. ............ 136/255; 136/261; 136/262
(58) Field of Classification Search ............ 136/255, 136/261, 262
See application file for complete search history.

(56) References Cited

U.S. PATENT DOCUMENTS

| | | | |
|---|---|---|---|
| 4,307,510 A | 12/1981 | Sawyer et al. | |
| 4,322,253 A * | 3/1982 | Pankove et al. | 438/528 |
| 4,370,510 A | 1/1983 | Stirn | |
| 4,545,109 A | 10/1985 | Reichert | |
| 4,551,394 A | 11/1985 | Betsch et al. | |
| 4,651,179 A | 3/1987 | Reichert | |
| 4,727,047 A | 2/1988 | Bozler et al. | |
| 4,774,205 A | 9/1988 | Choi et al. | |
| 4,789,643 A | 12/1988 | Kajikawa | |
| 4,826,784 A | 5/1989 | Salerno et al. | |
| 4,860,081 A | 8/1989 | Cogan | |
| 4,876,210 A * | 10/1989 | Barnett et al. | 117/58 |
| 4,948,456 A | 8/1990 | Schubert | |
| 4,963,508 A | 10/1990 | Umeno et al. | |
| 5,032,893 A | 7/1991 | Fitzgerald et al. | |
| 5,034,337 A | 7/1991 | Mosher et al. | |
| 5,061,644 A | 10/1991 | Yue et al. | |
| 5,079,616 A | 1/1992 | Yacobi et al. | |
| 5,091,333 A | 2/1992 | Fan et al. | |
| 5,091,767 A | 2/1992 | Bean et al. | |
| 5,093,699 A | 3/1992 | Weichold et al. | |
| 5,098,850 A | 3/1992 | Nishida et al. | |
| 5,105,247 A | 4/1992 | Cavanaugh | |
| 5,108,947 A | 4/1992 | Demeester et al. | |
| 5,156,995 A | 10/1992 | Fitzgerald et al. | |
| 5,159,413 A | 10/1992 | Calviello et al. | |
| 5,164,359 A | 11/1992 | Calviello et al. | |

(Continued)

FOREIGN PATENT DOCUMENTS

CN 2550906 5/2003

(Continued)

OTHER PUBLICATIONS

Hayashi, et al. "InGaAs quantum wells on wafer-bonded InP/GaAs substrates," J. Appl. Phys. 98, 093526, 2005.*

(Continued)

*Primary Examiner* — Basia Ridley
*Assistant Examiner* — Allison Bourke
(74) *Attorney, Agent, or Firm* — Slater & Matsil, L.L.P.

(57) ABSTRACT

Solar cell structures including multiple sub-cells that incorporate different materials that may have different lattice constants. In some embodiments, solar cell devices include several photovoltaic junctions.

11 Claims, 27 Drawing Sheets

U.S. PATENT DOCUMENTS

| | | | |
|---|---|---|---|
| 5,166,767 A | 11/1992 | Kapoor et al. |
| 5,223,043 A | 6/1993 | Olson et al. |
| 5,236,546 A | 8/1993 | Mizutani |
| 5,238,869 A | 8/1993 | Shichijo et al. |
| 5,256,594 A | 10/1993 | Wu et al. |
| 5,269,852 A | 12/1993 | Nishida |
| 5,269,876 A | 12/1993 | Mizutani |
| 5,272,105 A | 12/1993 | Yacobi et al. |
| 5,281,283 A | 1/1994 | Tokunaga et al. |
| 5,285,086 A | 2/1994 | Fitzgerald |
| 5,295,150 A | 3/1994 | Vangieson et al. |
| 5,356,831 A | 10/1994 | Calviello et al. |
| 5,403,751 A | 4/1995 | Nishida et al. |
| 5,405,453 A | 4/1995 | Ho et al. |
| 5,407,491 A | 4/1995 | Freundlich et al. |
| 5,410,167 A | 4/1995 | Saito |
| 5,417,180 A | 5/1995 | Nakamura et al. |
| 5,427,976 A | 6/1995 | Koh et al. |
| 5,432,120 A | 7/1995 | Meister et al. |
| 5,438,018 A | 8/1995 | Mori et al. |
| 5,461,243 A | 10/1995 | Ek et al. |
| 5,518,953 A | 5/1996 | Takasu |
| 5,528,209 A | 6/1996 | MacDonald et al. |
| 5,545,586 A | 8/1996 | Koh |
| 5,548,129 A | 8/1996 | Kubena |
| 5,589,696 A | 12/1996 | Baba |
| 5,621,227 A | 4/1997 | Joshi |
| 5,622,891 A | 4/1997 | Saito |
| 5,640,022 A | 6/1997 | Inai |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,825,240 A | 10/1998 | Geis et al. |
| 5,849,077 A | 12/1998 | Kenney |
| 5,853,497 A | 12/1998 | Lillington et al. |
| 5,869,845 A | 2/1999 | Vander Wagt et al. |
| 5,883,549 A | 3/1999 | De Los Santos |
| 5,886,385 A | 3/1999 | Arisumi et al. |
| 5,903,170 A | 5/1999 | Kulkarni et al. |
| 5,953,361 A | 9/1999 | Borchert et al. |
| 5,959,308 A | 9/1999 | Shichijo et al. |
| 5,966,620 A | 10/1999 | Sakaguchi et al. |
| 5,998,781 A | 12/1999 | Vawter et al. |
| 6,011,271 A | 1/2000 | Sakuma et al. |
| 6,015,979 A | 1/2000 | Sugiura et al. |
| 6,049,098 A | 4/2000 | Sato |
| 6,083,598 A | 7/2000 | Ohkubo et al. |
| 6,100,106 A | 8/2000 | Yamaguchi et al. |
| 6,110,813 A | 8/2000 | Ota et al. |
| 6,111,288 A | 8/2000 | Watanabe et al. |
| 6,121,542 A | 9/2000 | Shiotsuka et al. |
| 6,150,242 A | 11/2000 | Van der Wagt et al. |
| 6,153,010 A | 11/2000 | Kiyoku et al. |
| 6,191,432 B1 | 2/2001 | Sugiyama et al. |
| 6,225,650 B1 | 5/2001 | Tadatomo et al. |
| 6,228,691 B1 | 5/2001 | Doyle |
| 6,229,153 B1 | 5/2001 | Botez et al. |
| 6,235,547 B1 | 5/2001 | Sakuma et al. |
| 6,252,261 B1 | 6/2001 | Usui et al. |
| 6,252,287 B1 | 6/2001 | Kurtz et al. |
| 6,271,551 B1 | 8/2001 | Schmitz et al. |
| 6,274,889 B1 | 8/2001 | Ota et al. |
| 6,300,650 B1 | 10/2001 | Sato |
| 6,320,220 B1 | 11/2001 | Watanabe et al. |
| 6,325,850 B1 | 12/2001 | Beaumont et al. |
| 6,339,232 B1 | 1/2002 | Takagi |
| 6,340,788 B1 * | 1/2002 | King et al. ............... 136/261 |
| 6,342,404 B1 | 1/2002 | Shibata et al. |
| 6,348,096 B1 | 2/2002 | Sunakawa et al. |
| 6,352,942 B1 | 3/2002 | Luan et al. |
| 6,362,071 B1 | 3/2002 | Nguyen et al. |
| 6,380,051 B1 | 4/2002 | Yuasa et al. |
| 6,380,590 B1 | 4/2002 | Yu |
| 6,403,451 B1 | 6/2002 | Linthicum et al. |
| 6,407,425 B1 | 6/2002 | Babcock et al. |
| 6,456,214 B1 | 9/2002 | van de Wagt |
| 6,458,614 B1 | 10/2002 | Nanishi et al. |
| 6,475,869 B1 | 11/2002 | Yu |
| 6,492,216 B1 | 12/2002 | Yeo et al. |
| 6,500,257 B1 | 12/2002 | Wang et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |

| Patent/Pub No. | Date | Inventor |
|---|---|---|
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Leong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1* | 4/2003 | King et al. ............ 136/255 |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |

| | | |
|---|---|---|
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen et al. |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1* | 12/2005 | Fetzer et al. ............ 136/249 |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1* | 6/2006 | Atwater et al. ............ 136/255 |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0252861 A1 | 10/2010 | Lochtefeld |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0086498 A1 | 4/2011 | Cheng et al. |

FOREIGN PATENT DOCUMENTS

| | | |
|---|---|---|
| DE | 10017137 | 10/2000 |
| DE | 103 20 160 A1 | 8/2004 |
| EP | 0352472 | 6/1989 |
| EP | 0600276 | 6/1994 |
| EP | 0817096 | 1/1998 |
| EP | 1 551 063 | 7/2005 |
| EP | 1 796 180 | 6/2007 |
| GB | 2215514 | 9/1989 |
| JP | 2-62090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000-286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004-200375 | 7/2004 |
| JP | 2009177167 | 8/2009 |
| KR | 20030065631 | 8/2003 |
| KR | 20090010284 | 1/2009 |
| TW | 544930 | 8/2003 |
| WO | WO0072383 | 11/2000 |
| WO | WO0101465 | 1/2001 |
| WO | WO0209187 | 1/2002 |
| WO | WO 02/086952 | 10/2002 |
| WO | WO02088834 | 11/2002 |
| WO | WO03073517 | 9/2003 |
| WO | WO2004004927 | 1/2004 |
| WO | WO 2004/023536 | 3/2004 |
| WO | WO 2005/013375 | 2/2005 |
| WO | WO 2005/048330 | 5/2005 |
| WO | WO2005098963 | 10/2005 |
| WO | WO 2005/122267 | 12/2005 |
| WO | WO2006025407 | 3/2006 |
| WO | WO 2006/125040 | 11/2006 |
| WO | WO2008124154 | 10/2008 |

OTHER PUBLICATIONS

Follstaedt, et al. "Formation of cavities in GaAs in InGaAs," Nuclear Instruments and Methods in Physics Reserach B, 160, p. 476-498, 2000.*
Gibbons, "Ion implantation in semiconductors—Part II: Damage and Production and annealing," IEEE, vol. 60, No. 9, 1972.*
68 Applied Physics Letters 7, pp. 774-779 (1999).
Asano, T. et al., "AlGaInN laser diodes grown on an ELO-GaN substrate vs. on a sapphire substrate," 2000 IEEE Semiconductor Laser Conference, *Conference Digest*, pp. 109-110.
Ashby, C.I.H. et al., "Low-dislocation-density GaN from a single growth on a textured substrate." Applied Physics Letters, v 77, n 20, Nov. 13, 2000, pp. 3233-3235.
Ashley et al., "Heterogeneous InSb Quantum Well Transistors on Silicon for ultra-high speed, low power logic applications," 43 Electronics Letters 14 (Jul. 2007).

Bai et al, "Study of the defect elimination mechanisms in aspect ratio trapping Ge growth," Appl. Phys. Letters, vol. 90 (2007).
Bakkers et al., "Epitaxial Growth on InP Nanowires on Germanium," Nature Materials, vol. 3 (Nov. 2004), pp. 769-773.
Baron et al., "Chemical Vapor Deposition of Ge Nanocrystals on $SiO_2$," Applied Physics Letters, vol. 83, No. 7 (Aug. 18, 2003), pp. 1444-1446.
Bean et al., "GexSi1-x/Si strained-later superlattice grown by molecular beam epitaxy," J. Vac. Sci. Tech. A (2)2, pp. 436-440 (1984).
Beckett et al., "Towards a reconfigurable nanocomputer platform," ACM Int'l. Conf. Proceeding Series, vol. 19, pp. 141-150 (2002).
Beltz et al., "A Theoretical Model for Threading Dislocation Reduction During Selective Area Growth," Materials Science and Engineering, A234-236 (1997), pp. 794-797.
Bergman et al. "RTD/CMOS Nanoelectronic Circuits: Thin-Film InP-based Resonant Tunneling Diodes Integrated with CMOS circuits," 20 Electron Device Letters 3, pp. 119-122 (1999).
Blakeslee, "The Use of Superlattices to Block the Propogation of Dislocations in Semiconductors," Mat. Res. Soc. Symp. Proc. 148, pp. 217-227.
Borland, J.O., "Novel device structures by selective epitaxial growth (SEG)," *1987 International Electron Devices Meeting* pp. 12-15.
Bryskiewicz, T., "Dislocation filtering in SiGe and InGaAs buffer layers grown by selective lateral overgrowth method," Applied Physics Letters, v 66, n 10, Mar. 6, 1995, pp. 1237-1239.
Bushroa, A.R. et al., "Lateral epitaxial overgrowth and reduction in defect density of 3C-SiC on patterned Si substrates," Journal of Crystal Growth, v 271, Oct. 15, 2004, pp. 200-206.
Cannon et al., "Monolithic Si-based Technology for Optical Receiver Circuits," Proceedings of SPIE, vol. 4999 (2003), pp. 145-155.
Chan et al., "Influence of metalorganic Sources on the Composition Uniformity of Selectively Grown $Ga_xIn_{1-x}P$," Jpn J. Appl. Phys., vol. 33 (1994) pp. 4812-4819.
Chang et al., "Epitaxial Lateral Overgrowth of Wide Dislocation-Free GaAs on Si Substrates," Electrochemical Soc'y Proceedings, vol. 97-21, pp. 196-200.
Chang, Y.S. et al., "Effect of growth temperature on epitaxial lateral overgrowth of GaAs on Si substrate," Journal of Crystal Growth 174, Apr. 1997, p. 630-34.
Chau et al., "Opportunities and Challenges of III-V Nanoelectronics for Future High-Speed, Low Power Logic Applications," IEEE CSIC Digest, pp. 17-20 (2005).
Chen, Y. et al., "Dislocation reduction in GaN thin films via lateral overgrowth from trenches," Applied Physics Letters, v 75, n 14, Oct. 4, 1999, pp. 2062-2063.
Choi et al., "Monolithic Integration of GaAs/AlGaAs Double-Heterostructure LED's and Si MOSFET's," Electon Device Letters, v. EDL-7, No. 9 (1986).
Choi et al., "Monolithic Integration of GaAs/AlGaAs LED and Si Driver Circuit," 9 Electron Device Letters 10 (1988).
Choi et al., "Monolithic Integration of Si MOSFET's and GaAs MESFET's," Electron Device Letters, v. EDL-7, No. 4 (1986).
Cloutier et al., "Optical gain and stimulated emission in periodic nanopatterned crystalline silicon," Nature Materials, Nov. 2005.
Currie et al., "Carrier Mobilities and Process Stability of Strained Si n- and p-MOSFETs on SiGe Virtual Substrates," J. Vac. Sci. Tech. B 19(6), pp. 2268-2279 (2001).
Dadgar et al., "MOVPE Growth of GaN on Si (111) Substrates," Journal of Crystal Growth, 248 (2003) pp. 556-562.
Datta et al., "Silicon and III-V Nanoelectronics," IEEE Int'l. Conf. on Indium Phosphide & Related Mat., pp. 7-8 (2005).
Datta et al., "Ultrahigh-Speed 0.5 V Supply Voltage $In_{0.7}Ga_{0.3}As$ Quantum-Well Transistors on Silicon Substrate," 28 Electron Device Letters 8, pp. 685-687 (2007).
Davis, R.F. et al., "Lateral epitaxial overgrowth of and defect reduction in GaN thin films," 1998 *IEEE Lasers and Electro-Optics Society Annual Meeting*, pp. 360-361.
de Boeck et al., "The fabrication on a novel composite GaAs/$SiO_2$ nucleation layer on silicon for heteroepitaxial overgrowth by molecular beam epitaxy," Mat. Sci. and Engineering, B9 (1991), pp. 137-141.
Donaton et al., "Design and Fabrication of MOSFETs with a Reverse Embedded SiGe (Rev. e-SiGe) Structure," 2006 IEDM, pp. 465-468.
Dong-Ho Kim et al., "GaN nano epitaxial lateral overgrowth on holographically patterned substrates," 2003 *International Symposium on Compound Semiconductors*, pp. 27-28.
Epitaxial Lateral Overgrowth of GaAs on a Si Substrate, 28 Jap. J. App. Physics 3, pp. L337-L339 (Mar. 1989).
Examination Report in European Patent Application No. 06800414.2, mailed Mar. 5, 2009 (3 pages).
Fang et al., "Electrically pumped hybrid AlGaInAs-silicon evanescent laser," 14 Optics Express 20, pp. 9203-9210 (2006).
Feltin, E. et al., "Epitaxial lateral overgrowth of GaN on Si (111)," Journal of Applied Physics, v 93, n 1, Jan. 1, 2003, p. 182-5.
Feng et al., "Integration of Germanium-on-Insulator and Silicon MOSFETs on a Silicon Substrate," 27 Electron Device Letters 11, pp. 911-913 (2006).
Fiorenza et al., "Film Thickness Constraints for Manufacturable Strained Silicon CMOS," 19 Semiconductor Sci. Technol., pp. L4 (2004).
Fischer et al., "Elastic stress relaxation in SiGe epilayers on patterned Si substrates," 75 Journal of Applied Physics 1, pp. 657-659 (1994).
Fischer et al., "State of stress and critical thickness of Strained small-area SiGe layers," Phys. Stat. Sol. (a) 171, pp. 475-485 (1999).
Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9 (1990), pp. 949-955.
Fitzgerald et at., "Epitaxial Necking in GaAs Grown on Pre-patterned Si Substrates," Journal of Electronic Materials, vol. 20, No. 10 (1991), pp. 839-853.
Fitzgerald et al., "Nucleation Mechanisms and the Elimination of Misfit Dislocations at Mismatched Interfaces by Reduction in Growth Area," J. Applied Phys., vol. 65, No. 6, (Mar. 15, 1989), pp. 2220-2237.
Fitzgerald et al., "Structure and recombination in InGaAs/GaAs heterostructures," 63 Journal of Applied Physics 3, pp. 693-703 (1988).
Fitzgerald et al., "Totally relaxed $Ge_xSi_{1-x}$ layers with low threading dislocation densities grown on Si Substrates," 59 Applied Physics Letters 7, pp. 811-813 (1991).
Fitzgerald, "The Effect of Substrate Growth Area on Misfit and Threading Dislocation Densities in Mismatched Heterostructures," J. Vac. Sci. Technol. B, vol. 7, No. 4 (Jul./Aug. 1989), pp. 782-788.
Gallagher et al., "Development of the magnetic tunnel junction MRAM at IBM: From first junctions to a 16-Mb MRAM demonstrator chip," 50 IBM J. Research & Dev. 1 (2006).
Gallas et al, "Influence of Doping on Facet Formation at the $SiO_2$/Si Interface," Surface Sci. 440, pp. 41-48 (1999).
Geppert, L., "Quantum transistors: toward nanoelectronics," IEEE Spectrum, pp. 46-51 (Sep. 2000).
Gibbon et al., "Selective-area low-pressure MOCVD of GaInAsP and related materials on planar InP substrates" Semicond Sci Tech. 8, pp. 998-1010 (1993).
Glew et al., "New DFB grating structure using dopant-induced refractive index step," J. Crystal Growth 261 (2004) pp. 349-354.
Gould et al., "Magnetic resonant tunneling diodes as voltage-controlled spin selectors," 241 Phys. Stat. Sol. (B) 3, pp. 700-703 (2004).
Groenert et al., "Monolithic integration of room-temperature cw GaAs/AlGaAs lasers on Si substrates via relaxed graded GeSi buffer layers," 93 J. Appl. Phys. 362 (2003).
Gustafsson et al., "Cathodoluminescence from relaxed $Ge_xSi_{1-x}$ grown by heteroepitaxial lateral overgrowth," J. Crystal Growth 141 (1994), pp. 363-370.
Gustafsson et al., "Investigations of high quality $Ge_xSi_{1-x}$ grown by heteroepitaxial lateral overgrowth using cathodoluminescence," Inst. Phys. Conf. Ser. No. 134: Section 11, pp. 675-678 (1993).
Hayafuji et al., Jap. J. Appl. Phys. 29, pp. 2371 (1990).
Hersee, et al., "The Controlled Growth of GaN Nanowires," Nano Letters, vol. 6, No. 8 (2006), pp. 1808-1811.
Hiramatsu, K. et al., "Fabrication and characterization of low defect density GaN using facet-controlled epitaxial lateral overgrowth (FACELO)," Journal of Crystal Growth, v 221, Dec. 2000, pp. 316-326.

Hollander et al., "Strain and Misfit Dislocation Density in Finite Lateral Size $Si_{1-x}Ge_x$ Films Grown by Sective Epitaxy," Thin Solid Films, vol. 292, (1997) pp. 213-217.

Hu et al., "Growth of Well-Aligned Carbon Nanotube arrays on Silicon Substrates using Porous Alumina Film as a Nanotemplate," 79 App. Physics Letters 19 (2001).

Huang et al., "Electron and Hole Mobility Enhancement in Strained SOI by Wafer Bonding," 49 IEEE Trans. on Electron Devices 9, pp. 1566-1570 (2002).

International Preliminary Report on Patentability for International Application No. PCT/US07/020777, mailed Apr. 9, 2009 (12 pages).

International Preliminary Report on Patentability for International Application No. PCT/US07/021023, mailed Apr. 9, 2009 (8 pages).

International Preliminary Report on Patentability for International Application No. PCT/US2006/019152, mailed Nov. 29, 2007 (7 pages).

International Preliminary Report on Patentability for International Application No. PCT/US2007/019568, mailed Mar. 19, 2009 (7 pages).

International Preliminary Report on Patentability for International Application No. PCT/US2007/020181, mailed Apr. 2, 2009 (9 pages).

International Search Report and Written Opinion for International Application No. PCT/US07/020777, mailed Feb. 8, 2008 (18 pages).

International Search Report and Written Opinion for International Application No. PCT/US07/022392, mailed Apr. 11, 2008 (20 pages).

International Search Report and Written Opinion for International Application No. PCT/US2006/033859, dated Sep. 12, 2007 (22 pages).

International Search Report and Written Opinion for International Application No. PCT/US2007/019568, mailed Feb. 6, 2008 (13 pages).

International Search Report and Written Opinion for International Application No. PCT/US2007/020181, dated Jan. 25, 2008 (15 pages).

International Search Report and Written Opinion for International Application PCT/US2007/007373, dated Oct. 5, 2007 (13 pages).

International Search Report and Written Opinion for Patent Application No. PCT/US2006/019152, dated Oct. 19, 2006 (11 pages).

International Search Report and Written Opinion for Patent Application No. PCT/US2006/029247, dated May 7, 2007 (18 pages).

International Technology Roadmap for Semiconductors—Front End Processes, pp. 1-62 (2005).

Ipri, A.C. et al., "MONO/POLY technology for fabricating low-capacitance CMOS integrated circuits," *IEEE Transactions on Electron Devices*, vol. 35, No. 8, pp. 1382-1383, Aug. 1988.

IPRP for International Application No. PCT/US2006/029247, mailed Feb. 7, 2008 (12 pages).

IPRP for International Application No. PCT/US2006/033859, mailed Mar. 20, 2008 (14 pages).

Ishitani et al., "Facet Formation in Selective Silicon Epitaxial Growth," 24 Jap. J. Appl. Phys. 10, pp. 1267-1269 (1985).

Ismail et al., "High-quality GaAs on sawtooth-patterned Si substrates," 59 Applied Physics Letters 19, pp. 2418-2420 (1991).

Jain et al., "Stresses in strained GeSi stripes and quantum structures: calculation using the finite element method and determination using micro-Raman and other measurements," Thin Solid Films 292 (1997) pp. 218-226.

Jing Wang et al., "Fabrication of patterned sapphire substrate by wet chemical etching for maskless lateral overgrowth of GaN," Journal of the Electrochemical Society, v. 153, n. 3, Mar. 2006, p. C182-5.

Ju, W. et al., "Epitaxial lateral overgrowth of gallium nitride on silicon substrate," Journal of Crystal Growth, v. 263, Mar. 1, 2004, p. 30-4.

Kamiyama, S. et al., "UV laser diode with 350.9-nm-lasing wavelength grown by hetero-epitaxial-lateral overgrowth technology," *IEEE Journal of Selected Topics in Quantum Electronics*, vol. 11, No. 5, pp. 1069-1073, Sep.-Oct. 2005.

Kamiyama, S. et al., "UV light-emitting diode fabricated on hetero-ELO-grown $Al_{0.22}Ga_{0.78}N$ with low dislocation density," Physica Status Solidi A, v 192, n 2, Aug. 2002, pp. 296-300.

Kazi et al., "Realization of GaAs/AlGaAs Lasers on Si Substrates Using Epitaxial Lateral Overgrowth by Metalorganic Chemical Vapor Deposition," Jpn. J. Appl. Physics, vol. 40 (2001), pp. 4903-4906.

Kidoguchi, I. et al., "Air-bridged lateral epitaxial overgrowth of GaN thin films," Applied Physics Letters, v 76, n 25, Jun. 19, 2000, p. 3768-70.

Kimura et al., "Vibronic Fine Structure Found in the Blue Luminescence from Silicon Nanocolloids," Jpn. J. Appl. Physics, vol. 38 (1999), pp. 609-612.

Klapper, "Generation and Propagation of Dislocations During Crystal Growth," Mat. Chem. and Phys. 66, pp. 101-109 (2000).

Knall et al., Threading Dislocations in GaAs Grown with Free Sidewalls on Si mesas, J Vac. Sci. Technol. B, vol. 12, No. 6, (Nov./Dec. 1994) pp. 3069-3074.

Krost et al., "GaN-based Optoelectronics on Silicon Substrates," Materials Science & Engineering, B93 (2002) pp. 77-84.

Kushida, K. et al., "Epitaxial growth of $PbTiO_3$ films on $SrTiO_3$ by RF magnetron sputtering," *IEEE Transactions on Ultrasonics, Ferroelectrics and Frequency Control*, vol. 38, No. 6, pp. 656-662, Nov. 1991.

Kwok K Ng, Complete Guide to Semiconductor Devices, 2nd ed., Chapter 18 (2002).

Langdo et al., "High Quality Ge on Si by Epitaxial Necking," Applied Physics Letters, vol. 76, No. 25 (Jun. 20, 2000), pp. 3700-3702.

Langdo, "Selective SiGe Nanostructures," Ph.D. Thesis, Massachusetts Institute of Technology (2001).

Lee et al., "Strained-relieved, Dislocation-free $In_xGa_{1-x}As$/GaAs(001) Heterostructure by Nanoscale-patterned Growth," Applied Physics Letters, vol. 85, No. 18 (Nov. 1, 2004), pp. 4181-4183.

Lee, S.C. et al., "Growth of GaN on a nanoscale periodic faceted Si substrate by metal organic vapor phase epitaxy," *2003 International Symposium on Compound Semiconductors: Post-Conference Proceedings*, pp. 15-21.

Li et al., "Heteroepitaxy of High-quality Ge on Si by Nanoscale Ge seeds Grown through a Thin Layer of $SiO_2$," Applied Physics Letters, vol. 85, No. 11 (Sep. 13, 2004), pp. 1928-1930.

Li et al., Defect Reduction of GaAs Epitaxy on Si (001) Using Selective Aspect Ratio Trapping, 91 Applied Physics Letters 021114-1-021114-3 (2007).

Li et al., "Morphological Evolution and Strain Relaxation of Ge Islands Grown on Chemically Oxidized Si(100) by Molecular-beam Epitaxy," Journal of Applied Physics, vol. 98, (2005), pp. 073504-1-073504-8.

Li et al., "Selective Growth of Ge on Si(100) through vias of $SiO_2$ Nanotemplate Using Solid Source Molecular Beam Epitaxy," Applied Physics Letters, vol. 83, No. 24 (Dec. 15, 2003), pp. 5032-5034.

Liang et al., "Critical Thickness Enhancement of Epitaxial SiGe films Grown on Small Structures," Journal of Applied Physics, vol. 97, (2005) pp. 043519-1-043519-7.

Lim et al., "Facet Evolution in Selective Epitaxial Growth of Si by cold-wall ultrahigh vacuum chemical vapor deposition," J. Vac. Sci. Tech. B 22(2), p. 682 (2004).

Liu et al., "High Quality Single-crystal Ge on Insulator by Liquid-phase Epitaxy on Si Substrates," Applied Physics Letters, vol. 84, No. 14, (Apr. 4, 2004) pp. 2563-2565.

Liu et al., "Rapid Melt Growth of Germanium Crystals with Self-Aligned Microcrucibles on Si Substrates," Journal of the Electrochemical Society, vol. 152, No. 8, (2005) G688-G693.

Loo et al., "Successful Selective Epitaxial $Si_{1-x}Ge_x$ Deposition Process for HBT-BiCMOS and high Mobility Heterojunction pMOS Applications," 150 J. Electrochem. Soc'y 10, pp. G638-G647 (2003).

Lourdudoss, S. et al., "Semi-insulating epitaxial layers for optoelectronic devices," *2000 IEEE International Semiconducting and Insulating Materials Conference*, pp. 171-178, 2000.

Luan et al., "High-quality Ge Epilayers on Si with Low Threading-dislocation Densities," Applied Phsics Letters, vol. 75, No. 19, (Nov. 8, 1999) pp. 2909-2911.

Luan, "Ge Photodectors for Si Microphotonics," Ph.D. Thesis, Massachusetts Institute of Technology, Feb. 2001.

Lubnow et al., "Effect of III/V-Compound Epitaxy on Si Metal-Oxide-Semiconductor Circuits," Jpn. J. Applied Phys., vol. 33 (1994) pp. 3628-3634.

Luryi et al., "New Approach to the High Quality Epitaxial Growth of Latticed-mismatch Materials," Appl. Phys. Lett., vol. 49, No. 3, (Jul. 21, 1986) 140-142.

Martinez et al., "Characterization of GaAs Conformal Layers Grown by Hydride Vapour Phase Epitaxy on Si Substrates by Microphotoluminescence Cathodoluminescence and microRaman," Journal of Crystal Growth, vol. 210 (2000) pp. 198-202.

Matsunaga et al., "A New Way to Achieve Dislocation-free Heteroepitaxial Growth by Molecular Beam Epitaxy: Vertical Microchannel Epitaxy," Journal of Crystal Growth, 237-239 (2002) pp. 1460-1465.

Matthews et al., "Defects in Epitaxial Multilayers—Misfit Dislocations," J. Crystal Growth 27, pp. 118-125 (1974).

Monroy et al., "High UV/visible contrast photodiodes based on epitaxial lateral overgrown GaN layers," *Electronics Letters*, vol. 35, No. 17, pp. 1488-1489, Aug. 19, 1999.

Nakano, K. et al., "Epitaxial lateral overgrowth of AlN layers on patterned sapphire substrates," Source: Physica Status Solidi A, v 203, n 7, May 2006, pp. 1632-1635.

Nam et al., "Lateral Epitaxy of Low Defect Density GaN Layers via Organometallic Vapor Phase Epitaxy," Appl. Phys. Letters, vol. 71, No. 18, (Nov. 3, 1997) pp. 2638-2640.

Naoi et al, "Epitaxial Lateral Overgrowth of GaN on Selected-area Si(111) Substrate with Nitrided Si Mask," Journal of Crystal Growth, vol. 248, (2003) pp. 573-577.

Naritsuka et al., "InP Layer Grown on (001) Silicon Substrate by Epitaxial Lateral Overgrowth," Jpn. J. Appl. Physics, vol. 34 (1995), pp. L1432-L1435.

Naritsuka et al., "Vertical Cavity Surface Emitting Laser Fabricated on GaAs Laterally Grown on Si Substrate," Electrochemical Soc'y Proc. vol. 97-21, pp. 86-90.

Neudeck et al., "Novel silicon epitaxy for advanced MOSFET devices," *2000 IEDM Technical Digest*, pp. 169-172.

Neumann et a., "Growth of III-V resonant tunneling diode on Si Substrate with LP-MOVPE," J. of Crystal Growth 248, pp. 380-383 (2003).

Norman, A.G. et al., "Characterization of MOCVD lateral epitaxial overgrown III-V semiconductor layers on GaAs substrates," *2003 International Symposium on Compound Semiconductors*, pp. 45-46.

Partial International Search for International Application No. PCT/US2006/033859, 7 pages.

Parillaud et al, "High Quality InP on Si by Conformal Growth," Appl. Phys. Lett., vol. 68, No. 19 (May 6, 1996) pp. 2654-2656.

Park et al., "Defect Reduction and Its Mechanism of Selective Ge Epitaxy in Trenches on Si(001) Substrates Using Aspect Ratio Trapping," Mat. Res. Soc'y Symp. Proc., vol. 994 (2007).

Park et al., "Growth of Ge Thick Layers on Si(001) Substrates Using Reduced Pressure Chemical Vapor Deposition," 45 Japanese J. Applied Physics 11, pp. 8581-8585 (2006).

Partial International Search Report for International Application No. PCT/US2008/068377, mailed Apr. 7, 2009.

Park et al., "Defect Reduction of Selective Ge Epitaxy in Trenches on Si(001) Substrates using Aspect Ratio Trapping," 90 Appl. Physics Letters (2007).

Pidin et al., "MOSFET Current Drive Optimization Using Silicon Nitride Capping Layer for 65-nm Technology Node," 2004 Symp. on VLSI Technology, Dig. Tech. Papers, pp. 54-55.

Piffault, N. et al., "Assessment of the strain of InP films on Si obtained by HVPE conformal growth," Sixth *International Conference on Indium Phosphide and Related Materials, Conference Proceedings.*, pp. 155-158, Mar. 27-31, 1994.

Pribat et al., "High Quality GaAs on Si by Conformal Growth," Appl. Phys. Lett., vol. 60, No. 17 (Apr. 27, 1992) pp. 2144-2146.

Prost, W., ed. QUDOS Technical Report 2002-2004.

Reed et al., "Realization of a three-terminal resonant tunneling device: the bipolar quantum resonant tunneling transistor," 54 Appl. Phys. Letters 11, pp. 1034 (1989).

Ren, D. et al., "Low-dislocation-density, nonplanar GaN templates for buried heterostructure lasers grown by lateral epitaxial overgrowth," Applied Physics Letters, v 86, Mar. 14, 2005, 111901-1-111901-3.

Rim et al., "Enhanced Hole Mobilities in Surface-channel Strained-Si $p$-MOSFETs," 1995 IEDM, pp. 517-520.

Rim et al., "Fabrication and mobility characteristics of ultra-thin strained Si Directly on Insulator (SSDOI) MOSFETs," 2003 IEDM Tech. Dig., pp. 49-52.

Ringel et al., "Single-junction InGaP/GaAs Solar Cells Grown on Si Substrates with SiGe Buffer Layers," Prog. Photovolt.: Res. & Appl. 2002; 10:417-426.

Rosenblad et al., "A Plasma Process for Ultrafast Deposition of SiGe Graded Buffer Layers," 76 Applied Physics Letters 4, pp. 427-429 (2000).

Sakai, "Defect Structure in Selectively Grown GaN films with low threading dislocation density," Appl. Physics Letters 71(16), pp. 2259-2261 (1997).

Sakai, "Transmission electron microscopy of defects in GaN films formed by epitaxial lateral overgrowth," 73 App. Physics Letters 4, pp. 481-483 (1998).

Sakawa et al., "Effect of Si Doping on Epitaxial Lateral Overgrowth of GaAs on GaAs-Coated Si Substrate," Jpn. J. Appl. Physics, vol. 31 (1992), pp. L359-L361.

Sangwoo Pae et al., "Multiple layers of silicon-on-insulator islands fabrication by selective epitaxial growth," *IEEE Electron Device Letters*, vol. 20, No. 5, pp. 194-196, May 1999.

Schaub, J.D. et al., "Resonant-cavity-enhanced high-speed Si photodiode grown by epitaxial lateral overgrowth," *IEEE Photonics Technology Letters*, vol. 11, No. 12, pp. 1647-1649, Dec. 1999.

Seabaugh et al., "Promise of Tunnel Diode Integrated Circuits," Tunnel Diode and CMOS/HBT Integration Workshop, Dec. 9, 1999, Naval Research Laboratory.

Shahidi, G. et al., "Fabrication of CMOS on ultrathin SOI obtained by epitaxial lateral overgrowth and chemical-mechanical polishing," *1990 IEDM Technical Digest.*, pp. 587-590.

Shichijo et al., "Co-Integration of GaAs MESFET & Si CMOS Circuits," 9 Elec. Device Letters 9 (1988).

Siekkinen, J.W. et al., "Selective epitaxial growth silicon bipolar transistors for material characterization," *IEEE Transactions on Electron Devices*, vol. 35, No. 10, pp. 1640-1644, Oct. 1988.

Su et al., "Catalytic Growth of Group III-nitride Nanowires and Nanostructures by Metalorganic Chemical Vapor Deposition," Applied Physics Letters, vol. 86 (2005) pp. 013105-1-013105-3.

Sun, Y. et al., "Temporally resolved growth of InP in the openings off-oriented from [110] direction," *2000 International Conference on Indium Phosphide and Related Materials, Conference Proceedings*, pp. 227-230.

Sun, Y.T. et al., "InGaAsP multi-quantum wells at 1.5 μm wavelength grown on indium phosphide templates on silicon," *2003 International Conference on Indium Phosphide and Related Materials*, pp. 277-280.

Sun, Y.T.; Lourdudoss, S., "Sulfur doped indium phosphide on silicon substrate grown by epitaxial lateral overgrowth," *2004 International Conference on Indium Phosphide and Related Materials*, pp. 334-337.

Sun, Y.T.; Napierala, J.; Lourdudoss, S., "Selective area growth of InP on InP precoated silicon substrate by hydride vapor phase epitaxy," *2002 International Conference on Indium Phosphide and Related Materials Conference*, pp. 339-342.

Sun et al., "Thermal strain in Indium Phosphide on silicon obtained by Epitaxial Lateral Overgrowth," 94 J. of Applied Physics 4, pp. 2746-2748 (2003).

Suryanarayanan, G. et al., "Microstructure of lateral epitaxial overgrown InAs on (100) GaAs substrates," Applied Physics Letters, v 83, n 10, Sep. 8, 2003, p. 1977-9.

Su et al., "New planar self-aligned double-gate fully-depleted P-MOSFETs using epitaxial lateral overgrowth (ELO) and selectively grown source/drain (S/D)," *2000 IEEE International SOI Conference*, pp. 110-111.

Takasuka et al., "InGaAs/AlGaAs Quantum Wire DFB Buried HeteroStructure Laser Diode by One-Time Selective MOCVD on Ridge Substrate," 43 Jap. J. App. Phys. 4B (2005) pp. 2546-2548.

Takasuka et al., "AlGaAs/InGaAs DFB Laser by One-Time Selective MOCVD Growth on a Grating Substrate," 43 Jap. J. App. Phys. 4B (2004) pp. 2019-2022.

Tamura et al., "Heteroepitaxy on high-quality GaAs on Si for Optical Interconnections on Si Chip," Proceedings of the SPIE, vol. 2400, pp. 128-139 (1995).

Tamura et al., "Threading Dislocations in GaAs on Pre-patterned Si and in Post-patterned GaAs on Si," Journal of Crystal Growth, vol. 147, (1995) pp. 264-273.

Tanaka et al., "Structural Characterization of GaN Laterally Overgrown on a (111) Si Substrate," Applied Physics Letters, vol. 79, No. 7 (Aug. 13, 2001) pp. 955-957.

Thean et al., "Uniaxial-Biaxial Hybridization for Super-Critical Strained-Si Directly on Insulator (SC-SSOI) PMOS with Different Channel Orientations," IEEE, pp. 1-4 (2005).

Thompson et al., "A Logic Nanotechnology Featuring Strained-Silicon," 25 IEEE Electron Device Letters 4, pp. 191-193 (2004).

Tomiya, S. et al., "Dislocation related issues in the degradation of GaN-based laser diodes," *IEEE Journal of Selected Topics in Quantum Electronics*, vol. 10, No. 6, pp. 1277-1286, Nov.-Dec. 2004.

Tran et al., "Growth and Characterization of InP on Silicon by MOCVD," Journal of Crystal Growth, vol. 121, (1992) pp. 365-372.

Tsang, W. et al., "The heteroepitaxial ridge-overgrown distributed feedback laser," *IEEE Journal of Quantum Electronics*, vol. QE-21, No. 6, pp. 519-526, Jun. 1985.

Tsaur, B.-Y. et al., "Low-dislocation-density GaAs epilayers grown on Ge-coated Si substrates by means of lateral epitaxial overgrowth," Applied Physics Letters, v 41, n 4, Aug. 15, 1982, 347-9.

Tseng et al., "Effects of Isolation Materials on Facet Formation for Silicon Selective Epitaxial Growth," 71 Appl. Phys. Letters 16, pp. 2328 (1997).

Tsuji et al., "Selective Epitaxial Growth of GaAs on Si with Strained Sort-period Superlattices by Molecular Beam Epitaxy under Atomic Hydrogen Irradiation," J. Vac. Sci. Technol. B., vol. 22, No. 3, (May/Jun. 2004) pp. 1428-1431.

Usuda et al., "Strain relaxation of strained-Si layers on SiGe-on-insulator (SGOI) structures after mesa isolation," Applied Surface Sci. 224, pp. 113-116 (2004).

Usui et al., "Thick GaN Epitaxial Growth with Low Dislocation Density by Hydride Vapor Phase Epitazy," 36 Jap. J. of Applied Physics, pp. L899-L902 (1997).

Vanamu et al., "Epitaxial Growth of High-quality Ge Films on Nanostructured Silicon Substrates," Applied Physics Letters, vol. 88, (2006) pp. 204104-1-204104-3.

Vanamu et al., "Growth of High Quality $Ge/Si_{1-x}Ge_x$ on Nano-scale Patterned Si Structures," J. Vac. Sci. Techn. B, vol. 23, No. 4, (Jul./Aug. 2005) pp. 1622-1629.

Vanamu et al., "Heteroepitaxial Growth on Microscale Patterned Silicon Structures," Journal of Crystal Growth, vol. 280, (2005) pp. 66-74.

Vanamu et al., "Improving $Ge/Si_xGe_{1-x}$ Film Quality through Growth onto Patterned Silicon Substrates," Advances in Electronics Manufacturing Technology, V-EMT 1:25 (Nov. 8, 2004), pp. 1-4.

Vescan et al., "Lateral confinement by low pressure chemical vapor deposition-based selective epitaxial growth of $Si_{1-x}Ge_x/Si$ nanostructures," 81 J. of Applied Physics 10, pp. 6709-6715 (1997).

Ventury et al., "First Demonstration of AlGaN/GaN Heterostructure Field Effect Transistor on GaN grown by lateral epitaxial overgrowth (LEO)," Inst. Phys. Conf. Ser. No. 162: Ch. 5, pp. 177-183.

Wernersson et al., "InAs Epitaxial Lateral growth of W Masks," Journal of Crystal Growth, vol. 280 (2005) pp. 81-86.

Wuu, D.S. et al., "Defect reduction and efficiency improvement of near-ultraviolet emitters via laterally overgrown GaN on a GaN/patterned sapphire template," Applied Physics Letters, v 89, n 16, Oct. 16, 2006, pp. 161105-1-161105-3.

Xie et al., "From Porous Si to Patterned Si Substrate: Can Misfit Strain Energy in a Continuous Heteroepitaxial Film Be Reduced?" J Va. Sci. Technol. B, vol. 8, No. 2, (Mar./Apr. 1990) pp. 227-231.

Xu et al., "Spin-filter devices based on resonant tunneling antisymmetrical magnetic semiconductor hybrid structures," 84 App. Phys. Letters 11, pp. 1955-1957 (2004).

Yamaguchi et al., "GaAs Solar Cells Grown on Si Substrates for Space Use," Prog. Photovolt.: Res. Appl. 2001; 9:191-201.

Yamaguchi et al., "Defect Reduction Effects in GaAs on Si Substrates by Thermal Annealing," Appl. Phys. Letters 53(23), pp. 2293 (1988).

Yamaguchi et al., "Super-high-efficiency Multi-junction Solar Cells," Prog. Photovolt.: Res. Appl. 2005; 13:125-132.

Yamaguchi et al., "Analysis for Dislocation Density Reduction in Selective Area Grown GaAs Films on Si Substrates," Appl. Phys. Lett. vol. 56, No. 1, (Jan. 1, 1990) pp. 27-29.

Yamamoto et al., "Optimization of InP/Si Heteroepitaxial Growth Conditions Using Organometallic Vapor Phase Epitaxy," Journal of Crystal Growth, vol. 96, (1989) pp. 369-377.

Yang et al., "High Performance CMOS Fabricated on Hybrid Substrate with Different Crystal Orientations," 2003 IEDM Tech. Dig., pp. 453-456.

Yang et al., "Selective Area Deposited Blue GaN-InGaN Multiple-quantum Well Light Emitting Diodes over Silicon Substrates," Applied Physics Letter, vol. 76, No. 3, (Jan. 17, 2000) pp. 273-275.

Yin et al., "Ultrathin Strained-SOI by Stress Balance on Compliant Substrates and FET Performance," 52 IEEE Trans. on Electron Devices 10, pp. 2207-2214 (2005).

Dong et al., "Selective area growth of InP through narrow openings by MOCVD and its application to InP HBT," *2003 International Conference on Indium Phosphide and Related Materials*, pp. 389-392.

Yoon et al., "Selective Growth of Ge Islands on Noanometer-scale Patterned $SiO_2/Si$ Substrate by Molecular Beam Epitaxy," Applied Physics Letters, vol. 89 (2006) pp. 063107-1-063107-3.

Zamir et al., "Thermal Microcrack Distribution Control in GaN Layers on Si Substrates by Lateral Confined Epitaxy," Applied Physics Letters, vol. 78, No. 3, (Jan. 15, 2001) pp. 288-290.

Zang, K.Y. et al., "Nanoscale lateral epitaxial overgrowth of GaN on Si (111)," Applied Physics Letters, v 87, Nov. 7, 2005, p. 193106-1-193106-3.

Zang, K.Y. et al., "Nanoheteroepitaxial lateral overgrowth of GaN on nanoporous Si(111)," Applied Physics Letters, v 88, n 14, Apr. 3, 2006, p. 141925.

Zela et al., "Single-crystalline Ge Grown Epitaxially on Oxidized and Reduced Ge/Si (100) Islands," Journal of Crystal Growth, vol. 263 (2004) pp. 90-93.

Zhang et al., "Removal of Threading Dislocations from Patterned Heteroepitaxial Semiconductors by Glide to Sidewalls," Journal of Electronic Materials, vol. 27, No. 11, (1998) pp. 1248-1253.

Zhang et al., "Strain Status of Self-assembled InAs Quantum Dots," Applied Physics Letters, vol. 77, No. 9, (Aug. 28, 2000) pp. 1295-1297.

Zheleva, T.S.; Ok-Hyun Nam; Ashmawi, W.M.; Griffin, J.D.; Davis, R.F., "Lateral epitaxy and dislocation density reduction in selectively grown GaN structures," Journal of Crystal Growth, v 222, n 4, Feb. 2001, p. 706-18.

Zubia et al., "Initial Nanoheteroepitaxial Growth of GaAs on Si(100) by OMVPE." Journal of Electronic Materials, vol. 30, No. 7, (2001) pp. 812-816.

International Preliminary Report on Patentability for International Application No. PCT/US07/022392, mailed Apr. 30, 2009 (14 pages).

"Communication pursuant to Article 94(3) EPC," Application No. 06 770 525.1-2203, Applicant: Taiwan Semiconductor Company, Ltd., Feb. 17, 2011, 4 pages.

Ames, "Intel Says More Efficient Chips are Coming," PC World, available at: http://www.pcworld.com/printable/article/id,126044/printable.html (Jun. 12, 2006); 4 pages.

Asaoka, et al., "Observation of 1 f $^x$/noise of GaInP/GaAs triple barrier resonant tunneling diodes, "AIP Conf. Proc., vol. 780, Issue 1, 2005, pp. 492-495.

Belyaev, et al., "Resonance and current instabilities in AlN/GaN resonant tunneling diodes," 21 Physica E 2-4, 2004, pp. 752-755.

Berg, J., "Electrical Characterization of Silicon Nanogaps," Doktorsavhandlingar vid Chalmers Tekniska Hagskola, 2005, No. 2355, 2 pages.

Burenkov et al., "Corner Effect in Double and Triple Gate FinFETs" European solid-state device research, 33rd Conference on Essderc '03 Sep. 16-18, 2003, Piscataway, NJ, USA, IEEE, vol. 16, pp. 135-138, XPo10676716.

Calado, et al., "Modeling of a resonant tunneling diode optical modulator," University of Algarve, Department of Electronics and Electrical Engineering, 2005, pp. 96-99.

Campo et al., "Comparison of Etching Processes of Silicon and Germanium in SF6-O2 Radio-Frequency Plasma," 13 Journal of Vac. Sci. Tech., B-2, 1995, pp. 235-241.

Chang et al. "3-D simulation of strained Si/SiGe heterojunction FinFETs" Semiconductor Device Research Symposium, Dec. 10-12, 2003, pp. 176-177.

Chengrong, et al., "DBRTD with a high PVCR and a peak current density at room temperature," Chinese Journal of Semiconductors vol. 26, No. 10, Oct. 2005, pp. 1871-1874.

Choi, et al., "Low-voltage low-power K-band balanced RTD-based MMIC VCO," 2006 IEEE, Department of EECS, Korea Advanced Institute of Science and Technology, 2006, pp. 743-746.

Dong, Y., et al, "Selective area growth of InP through narrow openings by MOCVD and its application to InP HBT," 2003 International Conference on Indium Phosphide and Related Materials, May 12-16, 2003, pp. 389-392.

European Patent Office, Extended European Search Report and Search Opinion dated Jan. 26, 2011 in EP Patent Application No. 10003084.0-2203 (9 pages).

European Search Report issued by the European Patent Office on Dec. 15, 2010 in European Patent Application No. 10002884.4 (10 pages).

Golka, et al., "Negative differential resistance in dislocation-free GaN/AlGan double-barrier diodes grown on bulk GaN," 88 Applied Physics Letters 17, Apr. 2006, pp. 172106-1-172106-3.

Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.

Gruber, et al., "Semimagnetic Resonant Tunneling Diodes for Electron Spin Manipulation," Nanostructures: Physics & Technology, 8th International Symposium, 2000, pp. 483-486.

Hammerschmidt, "Intel to Use Trigate Transistors from 2009 on," EETIMES Online, available at: http://www.eetimes.com/showArticle.jhtml?articleID=189400035 (Jun. 12, 2006). 1 page.

Hasegawa, et al., "Sensing Terahertz Signals with III-V Quantum Nanostructures," Quantum Sensing: Evolution and Revolution from Past to Future, SPIE 2003, pp. 96-105.

Yanlong, et al., "Monolithically fabricated OEICs using RTD and MSM," Chinese Journal Semiconductors vol. 27, No. 4, Apr. 2006, pp. 641-645.

Ying-Long, et al., "Resonant tunneling diodes and high electron mobility transistors integrated on GaAs substrates," Chinese Physics Letters 23, vol. 3, Mar. 2006, pp. 697-700.

Hydrick et al., "Chemical Mechanical Polishing of Epitaxial Germanium on $SiO_2$-patterned Si(001) Substrates," ECS Transactions, 16 (10), 2008, (pp. 237-248).

Intel Press Release, "Intel's Tri-Gate Transistor to Enable Next Era in Energy-Efficient Performance," Intel Corporation (Jun. 12, 2006). 2 pages.

Intel to Develop Tri-Gate Transistors Based Processors, available at: http://news.techwhack.com/3822/tri-gate-transistors/ (Jun. 13, 2006) 6 pages.

International Search Report and Written Opinion for International Application No. PCT/US2007/021023 mailed Jun. 6, 2008, 10 pages.

International Search Report for International Application No. PCT/US2006/019152, mailed May 17, 2005. 11 pages.

Ishibashi, et al., "3rd Topical Workshop on Heterostructure Microelectronics for Information Systems Applications," Aug.-Sep. 1998, 115 pages.

Jeong, et al., "Performance improvement of InP-based differential HBT VCO using the resonant tunneling diode," 2006 International Conf. on Indium Phosphide and Related Mat. Conf. Proc., pp. 42-45.

Kamins et al., "Kinetics of Selective Epitaxial Depostion of Si1-xGex," Hewlett-Packard Company, Palo Alto, CA, Appl. Phys. Lett. 61 (6), Aug. 10, 1992 (pp. 669-671).

Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.

Kim et al., "Silicon-Based Field-Induced Band-to-Band Tunneling Effect Transistor," IEEE Electron Device Letters, No. 25, No. 6, 2004, pp. 439-441.

Kollonitsch, et al., "Improved Structure and Performance of the GaAsSb/InP Interface in a Resonant Tunneling Diode," Journal of Crystal Growth, vol. 287, 2006, pp. 536-540.

Krishnamurthy, et al., "I-V characteristics in resonant tunneling devices: Difference Equation Method," Journal of Applied Physics, vol. 84, Issue 9, Condensed Matter: Electrical and Magnetic Properties (PACS 70-76), 1998, 9 pages.

Sudirgo et al., "Si-Based Resonant Interband Tunnel Diode/CMOS Integrated Memory Circuits," Rochester Institute of Technology, IEEE, 2006, pp. 109-112.

Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.

Kwok, "Barrier-Injection Transit Time Diode, Complete Guide to Semiconductor Devices," $2^{nd}$ ed., Chapter 18, 2002, pp. 137-144.

Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.

Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.

Luo et al., Enhancement of (IN,Ga)N Light-Emitting Diode Performance by Laser Liftoff and Transfer Sapphire to Silicon, IEEE Photonics Technology Letters, vol. 14, No. 10, 2002, pp. 1400-1402.

Ma, et al., "A small signal equivalent circuit model for resonant tunneling diode," Chinese Physics Letters, vol. 23, No. 8, Aug. 2006, pp. 2292-2295.

Ma, et al., "Fabrication of an AlAs/In0.53/Ga0.47/As/InAs resonant tunneling diode on InP substrate for high-speed circuit applications," 27 Chinese J. Semiiconductors 6, Jun. 2006, pp. 959-962.

Maekawa, et al., "High PVCR Si/Si1-x/Gex DW RTD formed with a new triple-layer buffer," Materials Science in Semiconductor Processing, vol. 8, 2005, pp. 417-421.

Maezawa, et al., "Metamorphic resonant tunneling diodes and its application to chaos generator ICs," 44 Jap. J. Applied Physics, Part 1, No. 7A, Jul. 2005, pp. 4790-4794.

Maezawa, et al., "InP-based resonant tunneling diode/HEMT integrated circuits for ultrahigh-speed operation," IEEE Nagoya University, Institute for Advanced Research, 2006, pp. 252-257.

Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.

Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.

Noda, et al., "Current-voltage characteristics in double-barrier resonant tunneling diodes with embedded GaAs quantum rings," Physica E 32, 2006, pp. 550-553.

Notification of Transmittal of the International Search Report and the Written Opinion of the International Searching Authority for PCT/US2010/029552, Applicant: Taiwan Semiconductor Manufacturing Company, Ltd., May 26, 2010, 14 pages.

Oehrlein et al., "Studies of the Reactive Ion Etching of SiGe Alloys," J. Vac. Sci. Tech, A9, No. 3, May/Jun. 1991, pp. 768-774.

Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.

Park et al., "Fabrication of Low-Defectivity, Compressively Strained Geon $Si_{0.2}G^e{}_{0.8}$ Structures Using Aspect Ratio Trapping," Journal of The Electrochemical Society, vol. 156, No. 4, 2009, pp. H249-H254.

Partial International Search Report for International Application No. PCT/US2008/004564 completed Jul. 22, 2009, mailed Oct. 16, 2009, 5 pages.

PCT International Search Report of PCT/US2009/057493, from PCT/ISA/210, mailed Mar. 22, 2010, Applicant: Amberwave System Corporation et al., 2 pages.

Prost, et al., "High-speed InP-based resonant tunneling diode on silicon substrate," Proceedings of the 31st European Solid-State Device Research Conf., 2005, pp. 257-260.

Radulovic, et al., "Transient Quantum Drift-Diffusion Modelling of Resonant Tunneling Heterostructure Nanodevices," Physics of Semiconductors: 27th International Conference on the Physics of Semiconductors—ICPS-27, Jun. 2005 AIP Conf. Proc., pp. 1485-1486.

Sass, et al., "Strain in GaP/GaAs and GaAs/GaP resonant tunneling heterostructures," Journal of Crystal Growth, vol. 248, Feb. 2003, pp. 375-379.

Shubert, E.F., "Resonant tunneling diode (RTD) structures," Rensselear Polytechnic Institute, 2003, pp. 1-14.

Suhara, et al, "Characterization of argon fast atom beam source and its application to the fabrication of resonant tunneling diodes," 2005 International Microprocesses and Nanotechnology Conf. Di. Of Papers, 2005, pp. 132-133.

Sun et al., Electron resonant tunneling through InAs/GaAs quantum dots embedded in a Schottky diode with an AlAs insertion layer, 153 J. Electrochemical Society 153, 2006, pp. G703-G706.

Sun et al., "Room-temperature observation of electron resonant tunneling through InAs/AlAs quantum dots," 9 Electrochemical and Solid-State Letters 5, May 2006, pp. G167-G170.

Suzuki, et al., "Mutual injection locking between sub-THz oscillating resonant tunneling diodes," Japan Science and Technology Agency, IEEE, Joint 30th International Conference on Infrared and Millimeter Waves & 13th International Conference on Terahertz Electronics, 2005, pp. 150-151.

Thelander, et al., "Heterostructures incorporated in one-dimensional semiconductor materials and devices," Physics of Semiconductors, vol. 171, 2002, 1 page. Abstract Only.

Tomiya, "Dependency of crystallographic tilt and defect distribution of mask material in epitaxial lateral overgrown GaN layers," Applied Physics Letters vol. 77, No. 5, pp. 636-638.

Tsai, et al., "InP/InGaAs resonant tunneling diode with six-route negative differential resistances," 13th European Gallium Arsenide and other Compound Semiconductors Application Symp., 2006, pp. 421-423.

Ujiie, et al., Epitaxial Lateral Overgrowth of GaAs on a Si Substrate, 28, Japan, Journal of Applied Physics, vol. 3, Mar. 1989, pp. L337-L339.

Walker, et al., "Magnetotunneling spectroscopy of ring-shaped (InGa)As quantum dots: Evidence of excited states with 2pz character," 32 Physica E 1-2, May 2006, pp. 57-60.

Ting, et al., "Modeling Spin-Dependent Transport in InAS/GaSb/AlSb Resonant Tunneling Structures," J. Computational Electronics, 2002, pp. 147-151.

Watanabe, et al., "Fluoride resonant tunneling diodes on Si substrates," IEEE International Semiconductor Device Research Symp. Dec. 2005, pp. 177-178.

Williams et al., "Etch Rates for Micromachining Processing—Part II," Journal of Microelectromechanical Systems, vol. 4, 1996, pp. 761-778.

Williams et al., "Etch Rates for Micromachining Processing—Part II," Journal of Microelectromechnical Systems, vol. 5, No. 4, Dec. 1996, pp. 256-269.

Wu et al., "Enhancement-mode InP n-channel metal-oxide-semiconductor field-effect-transistors with atomic-layer-deposited Al2O3 dielectrics," Applied Physics Letters 91, 022108-022110 (2007).

Wu et al., Gross-Sectional Scanning/Tunneling Microscopy Investigations of Cleaned III-V Heterostructures, Technical report, Dec. 1996, 7 pages.

Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.

Yili, et al., "Physics-based hydrodynamic simulation of direct current characteristics in DBRTD," 29 Chinese J. Electron Devices 2, Jun. 2006, pp. 365-368.

Yoshizawa et al., "Growth of self-Organized GaN Nanostructures on Al 2O3 (0001) by RF-Radial Source Molecular Beam Epitaxy", Japan, Journal of Applied Phsyics, Part 2, vol. 36, No. 4B, 1997, pp. L459-L462.

"Resonant-Tunneling Diode," Complete Guide to Semiconductor Devices, Chapter 10.

Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.

International Search Report and Written Opinion for International Application No. PCT/US2008/068377, mailed Jul. 6, 2009, 19 pages.

* cited by examiner

MULTI-JUNCTION SOLAR CELLS

RELATED APPLICATIONS

This application claims priority to and the benefit of U.S. provisional patent application No. 60/970,808, filed Sep. 7, 2007, and 60/980,103, filed Oct. 15, 2007. The disclosures of both of these applications are incorporated by reference herein in their entireties.

FIELD OF THE INVENTION

The present invention relates to multi-junction solar cells that convert sunlight to electricity.

BACKGROUND

The need for lattice matching, or quasi-lattice matching, is a constraint on efforts to build high-efficiency III-V multi-junction solar cells. Lattice matching in solar cells reduces crystallographic defects that may cause non-radiative recombination of electron-hole pairs. (When pairs recombine before a p-n junction separates them, the efficiency of the solar cell diminishes.) Presently, the need for lattice-matching strongly influences selection of materials for use in solar cells and, as a result, efficiency may be compromised.

SUMMARY

Embodiments of the present invention allows different materials in a multi-junction solar cell to be selected to increase the cell's performance without being constrained by the need for lattice-matching. Bandgaps and lattice constants of common III-V semiconductors are indicated in FIG. 1. Recently it has been demonstrated that solar cells using a substantially lattice-matched indium gallium phosphide/gallium arsenide/germanium (InGaP/GaAs/Ge) configuration (illustrated with dashed lines in FIG. 1) formed on Ge substrates achieved the relatively high efficiency of 40.1% in converting sunlight into electricity. A solar cell's energy conversion efficiency ($\eta$, "eta") is the percentage of power converted (from absorbed light to electrical energy) and collected, when a solar cell is connected to an electrical circuit. This value may be calculated using a ratio of a maximum power point, $P_m$, to the input light irradiance (E, in W/m$^2$) under standard test conditions (STC) and the surface area of the solar cell according to the following equation ($A_c$ in m$^2$).

$$\eta = \frac{P_m}{E \times A_c}$$

STC are typically a temperature of 25° C. and an irradiance of 1000 W/m$^2$ with an air mass of 1.5 (AM1.5) spectrum.

A three-junction solar cell tailored to increase efficiency without regard for lattice matching, however, may employ a configuration other than the aforementioned InGaP/GaAs/Ge configuration, because the bandgaps (shown in Table 1 below) of the lattice-matched materials offer a sub-optimal way of capturing the solar spectrum. In particular, the theoretical efficiency of a solar cell reaches its maximum when it absorbs each portion of the sun's spectrum with a material that has a bandgap close to the photon energy of the respective portion of the sun's spectrum. In the example of FIG. 1, the 1.42 eV bandgap of GaAs is far from the bandgap of approximately 1.1 eV that was determined by modeling to be more suitable as the middle material in a three-junction cell with InGaP and Ge. The modeling included making a mathematical model of each sub-cell in which the bandgap is one of the variables, setting the currents equal to each other, and running an efficiency optimization algorithm varying each bandgap.

The different photovoltaic cells that make up a multi-junction cell may be referred to herein as "sub-cells," Including photovoltaic sub-cells or solar sub-cells. Thus, a sub-cell is a fully functional photovoltaic cell, and multiple sub-cells are included in the devices described herein. The preferred bandgap of the materials of a sub-cell in a multi-junction solar cell is determined by several factors. If the bandgap in a sub-cell is too high, then photons with an energy below the bandgap may pass through the sub-cell without being absorbed, and the energy of that photon may be lost unless it is absorbed by a lower cell. If the bandgap of a sub-cell is too low, then more photons may be absorbed by that sub-cell, but the higher energy photons may be absorbed inefficiently. A preferred bandgap energy represents a compromise between these two effects.

TABLE 1

Bandgaps of $In_{0.5}Ga_{0.5}P$, GaAs, and Ge

| Material | Bandgap (eV) |
|---|---|
| $In_{0.5}Ga_{0.5}P$ | 1.86 |
| GaAs | 1.42 |
| Ge | 0.66 |

FIG. 2 shows several possible combinations of materials for a three-junction solar cell with bandgaps that provide a theoretical ability to convert solar energy to electricity with 63.2% efficiency.

As discussed in detail below, embodiments that use silicon (Si) as a middle sub-cell in a multi-junction solar cell provide improved performance and reduced cost. Various embodiments described herein use Si in solar cell configurations that utilize Si substrates and modern Si processing. In some embodiments, aspect ratio trapping (ART) techniques provide an effective mechanism for depositing high-quality non-lattice-matched materials on Si. See, e.g., U.S. Patent Publication No. 2006/0292719, incorporated by reference herein.

While Ge is currently the substrate of choice in III-V solar cells because of the lattice match of Ge with GaAs, two practical issues are associated with the use of Ge as a substrate. First, Ge substrates contribute to the high cost of III-V solar cells: they are smaller and more expensive than Si substrates, and they rule out modern Si processing as a cost-reduction technique. Also, the limited supply of Ge substrates may restrict growth of the market for these devices.

Two key technical barriers hinder the integration of III-V solar cells onto a Si platform: the mismatch of lattice constants and the mismatch of thermal expansion coefficients. In particular, when a material with a lattice constant greater than that of Si is grown on Si, its atoms experience compressive strain because they adopt the shorter interatomic distances of the Si template. Below a critical thickness $t_c$ (typically several atomic layers for materials with substantial mismatch), the epitaxial layer remains "pseudomorphic" or "fully strained." Above $t_c$, the epitaxial layer relaxes, i.e., it assumes its normal lattice parameters to relieve the strain. Misfit dislocations appear at—and propagate along—the interface between the substrate and the epitaxial layer.

Misfit dislocations terminate at the edge of a crystal or at a threading dislocation, i.e., a defect that propagates upward from the interface. In cubic lattices, threading dislocations lie along <110> crystal directions; they typically approach the surface at a 45° angle to the substrate. Threading dislocations may degrade device performance and reliability. In solar cells, they may promote recombination of electrons and holes, thereby reducing efficiency. The threading dislocation density (TDD) in III-V materials grown directly on Si is typically approximately $10^9/cm^2$.

Thermal expansion mismatch may lead to processing difficulties. Growth temperatures of III-V films typically range from 450° C. to 800° C. When a Si substrate cools, the III-V material disposed thereover may contract more than the Si. The substrate may bow in a concave manner, stressing and ultimately cracking the film.

Previous efforts to integrate non-Si semiconductors onto Si substrates have relied primarily on three approaches: graded buffer layers, wafer bonding, or selective epitaxy on mesa regions. Each of these approaches has demonstrated significant limitations, as described below.

Graded buffer layers provide a gradual change in lattice constant from the silicon substrate to the active region of the epitaxial material. However, the typical thickness of the graded buffer layer (10 micrometers (µm) of epitaxial growth for a 4% lattice-mismatch) increases the expense of epitaxy and exacerbates cracking.

Wafer bonding involves growing devices on lattice-matched substrates, then lifting off the devices and bonding them to a Si substrate. This approach is relatively costly and may be incompatible with modern Si processing. Furthermore, the difference between the thermal expansion coefficients of the bonded materials and the Si may lead to cracking.

Selective epitaxy on mesa regions is a technique that attempts to exploit the glissile behavior of some dislocations. The strategy includes depositing III-V materials in mesa regions 10 to 100 µm in length, thereby providing a short path along which threading dislocations may glide to the edge of the region and remove themselves from the device. However, structures created by selective epitaxy on mesa regions typically have a high TDD, above $10^8/cm^2$, perhaps because selective epitaxy may not remove sessile (immobile) dislocations, which dominate when the lattice-mismatch exceeds 2%.

While some embodiments of the invention may include elements of the foregoing approaches, other embodiments take advantage of the ART approach to integrate non-Si semiconductors onto Si substrates.

In an aspect, embodiments of the invention feature a structure including a semiconductor substrate having a top surface and a bottom surface. A top insulator layer is disposed proximate the top surface of the substrate and defines a top opening. A bottom insulator layer is disposed proximate the bottom surface of the substrate and defines a bottom opening. A first crystalline layer is disposed within the top opening, the first crystalline layer being lattice-mismatched to the semiconductor substrate, with a majority of lattice-mismatch defects that arise at a surface of the first crystalline layer nearest the substrate terminating within the top opening. A second crystalline layer is disposed within the bottom opening. The second crystalline layer being lattice-mismatched to the semiconductor substrate, and a majority of lattice-mismatch defects arising at a surface of the second crystalline layer nearest the substrate terminate within the bottom opening.

In another aspect, an embodiment of the invention features a structure including a substrate, and a first photovoltaic sub-cell formed above the substrate, including a first semiconductor material having a first lattice constant. A second photovoltaic sub-cell is formed below the first sub-cell, and includes a second semiconductor material having a second lattice constant different from the first lattice constant. A third photovoltaic sub-cell is formed below the second photovoltaic cell and below the substrate, and includes a third semiconductor material having a third lattice constant different from the second lattice constant.

In some embodiments, the first semiconductor material includes or consists essentially of a III-V compound, and the first photovoltaic sub-cell comprises a first photovoltaic junction defined by the III-V compound. The second photovoltaic sub-cell may include a second photovoltaic junction defined in the substrate. In a particular embodiment, the first photovoltaic sub-cell includes a first III-V compound, the second photovoltaic sub-cell includes or consists essentially of silicon, and the third photovoltaic cell includes a second III-V compound. In various embodiments, the substrate includes silicon. A compositionally graded buffer layer may be disposed between the first and second photovoltaic sub-cells. A defect-trapping layer may be disposed between the first and second photovoltaic sub-cells, the defect-trapping layer including (i) a crystalline material comprising defects arising from lattice-mismatch of the crystalline material with an adjacent semiconductor material and (ii) a non-crystalline material, the defects terminating at the non-crystalline material.

In still another aspect, an embodiment of the invention includes a structure comprising includes a first photovoltaic sub-cell including a first semiconductor material having a first lattice constant and a first bandgap energy. A second photovoltaic sub-cell includes a second semiconductor material having a second lattice constant different from the first lattice constant and a second bandgap energy lower than the first bandgap energy. A defect-trapping layer is disposed between the first and second photovoltaic sub-cells, and has a third bandgap energy higher than the second bandgap energy. The defect-trapping layer includes a crystalline material proximate and in contact with a non-crystalline material, the crystalline material including defects terminating at the non-crystalline material.

In another aspect, embodiments of the invention include a structure featuring a first defect-trapping layer that includes a first crystalline material proximate and in contact with a first non-crystalline material, with the first crystalline material including defects arising from a lattice-mismatch of the first crystalline material to a first adjacent material, the defects terminating at the first non-crystalline material. A second defect-trapping layer is disposed below the first defect-trapping layer. The second defect-trapping layer includes a second crystalline material proximate and in contact with a second non-crystalline material. The second crystalline material includes defects arising from a lattice-mismatch to a second adjacent material, the defects terminating at the second non-crystalline material.

The first and second defect-trapping layers may be disposed on opposite sides of a substrate, the substrate includes the first and second adjacent materials, which may be the same material. The first and second defect-trapping layers may each be disposed above a substrate, which includes the first adjacent material, and the first crystalline material includes the second adjacent material. A solar cell is disposed between the first and second defect-trapping layers, below the second defect-trapping layer, or above the first defect-trapping layer. A first semiconductor layer having a first lattice constant is disposed above the first defect-trapping layer, and a second semiconductor layer having a second lattice constant different from the first lattice constant is disposed above the second defect-trapping layer.

In still another aspect, the invention includes a method of forming a photonic device. The method includes providing a substrate. A first active photonic device layer above the substrate, and a second active photonic device layer is formed below the substrate. Forming each of the first and second active photonic device layers includes epitaxial growth. The substrate may include a third photonic device layer. The first active photonic device layer may include a first solar cell junction and the second active photonic device layer may include a second solar cell junction.

In another aspect, an embodiment of the invention features a multi-junction solar cell device. The device includes a first solar cell including a first non-Si photovoltaic junction, a second solar cell disposed below the first solar cell and including a Si photovoltaic junction, and a third solar cell disposed below the second solar cell and second a second non-Si photovoltaic junction.

In yet another aspect, embodiments of the invention feature a multi-junction solar cell device. The device includes a first solar sub-cell having a first energy bandgap. It also includes a second solar sub-cell formed below the first solar sub-cell and having a second energy bandgap greater than the first energy bandgap and approximately equal to 1.1 eV. A third solar sub-cell is formed below the second solar cell and has a third energy bandgap greater than the second energy bandgap. The first energy bandgap may be less than 1.1 eV, and preferably less than about 0.8 eV, and the third energy bandgap may be greater than 1.1 eV. The second bandgap is generally selected from a range of about 1.0 eV to about 1.2 eV. The third energy bandgap is generally greater than about 1.6 eV.

DETAILED DESCRIPTION

As used herein, the terms "solar cell," "photovoltaic cell," and "photovoltaic sub-cell" each denote a structure having a photovoltaic junction, e.g., a p-n junction. A "photonic device layer" refers to a photoactive device, such as a solar cell.

ART enables solar-cell designers to select junction materials on the basis of their bandgaps without being constrained by their lattice constants. It also enables solar cell manufacturers to take advantage of inexpensive Si substrates and modern Si processing technologies. Multi-junction solar cells fabricated on Si substrates by ART also offer good mechanical strength, light weight, and superior heat dissipation in comparison to Ge substrates. The superior heat dissipation may be especially important in concentrator applications, since solar cells generally work less efficiently at elevated temperatures.

ART substantially eliminates problems from threading dislocations arising from a mismatch between the lattice constants of a film and an underlying substrate. It reduces stress due to the mismatch in thermal expansion coefficients, employs standard equipment, and does not require prohibitively expensive processes.

Figure 3:
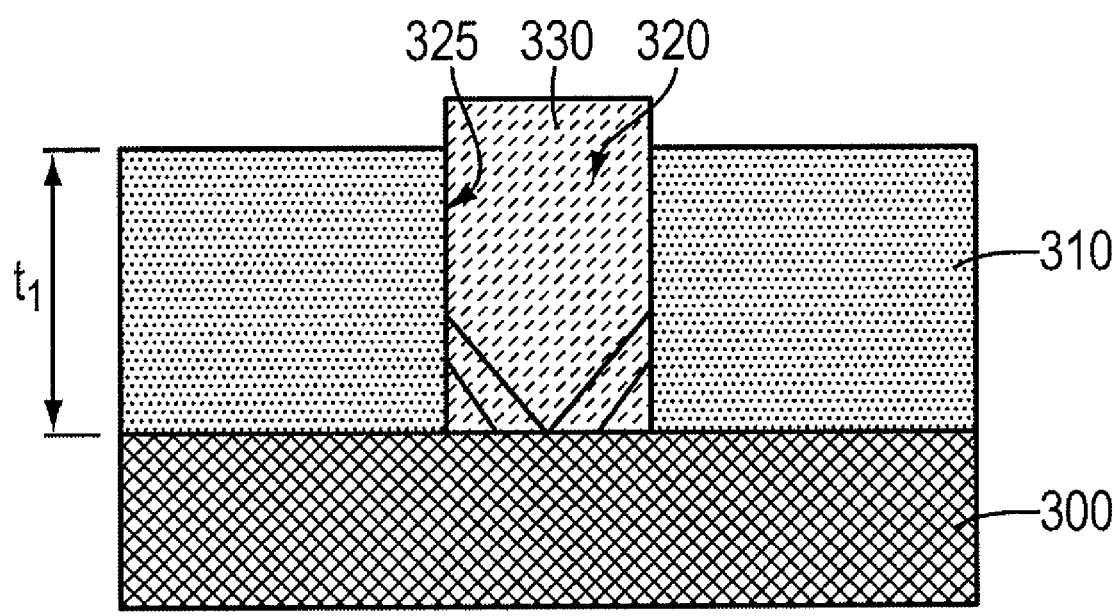
FIG. 3 is a schematic diagram illustrating the basic principles of ART.

Referring to FIG. 3, an ART structure may be formed in accordance with the following steps. A semiconductor substrate 300, i.e., a semiconductor wafer, is provided. The semiconductor substrate 300 may include a semiconductor material and may be, for example, a bulk silicon wafer, or a bulk germanium wafer. The substrate 300 may include or consist essentially of a first semiconductor material, such as a group IV element, e.g., germanium or silicon. In an embodiment, the substrate 300 includes or consists essentially of (300) silicon.

A dielectric layer 310, including a dielectric material, i.e., a non-crystalline material such as $SiO_2$ is formed over the semiconductor substrate 300. $SiO_2$ is just one example of a dielectric material, and those of skill in the art may substitute other materials, such as $SiN_x$, as appropriate, for example, to reduce recombination effects. The dielectric layer 310 may be formed by a method known to one of skill in the art, e.g., thermal oxidation or plasma-enhanced chemical vapor deposition (PECVD) in a suitable system, such as the CENTURA ULTIMA manufactured by Applied Materials, based in Santa Clara, Calif. The dielectric layer may have a thickness $t_1$ corresponding to a desired height of crystalline material to be deposited in an opening formed through the dielectric layer. In some embodiments, the thickness $t_1$ of the dielectric layer 310 may range from, e.g., 25 nm to 20 μm.

A plurality of narrow, sub-micron-width openings, e.g., trenches 320, are defined in the dielectric layer 310 by conventional lithography and reactive ion etching, with the openings having dielectric sidewalls 325. Those of skill also understand how to perform additional steps to adapt the process for various applications, such as treating $SiO_2$ with a hydrogen plasma to passivate the sidewalls of the trench.

After cleaning, a lattice-mismatched material 330 is selectively grown within the opening 320. The lattice-mismatched material may be, e.g., a semiconductor or Ge, grown in the opening by, e.g., selective epitaxy. The threading dislocations in the lattice-mismatched material typically slope towards the sidewalls of the opening and terminate when they reach the dielectric material, e.g., $SiO_2$. Accordingly, a region of the epitaxial material near the top of the trench is preferably substantially free of dislocations.

An ART structure may be used as a defect-trapping layer in the solar cells discussed below. The ART structure includes (i) a crystalline material including defects arising from lattice-mismatch of the crystalline material with an adjacent semiconductor material and (ii) a non-crystalline material, with the defects terminating at the non-crystalline material.

Figure 4:
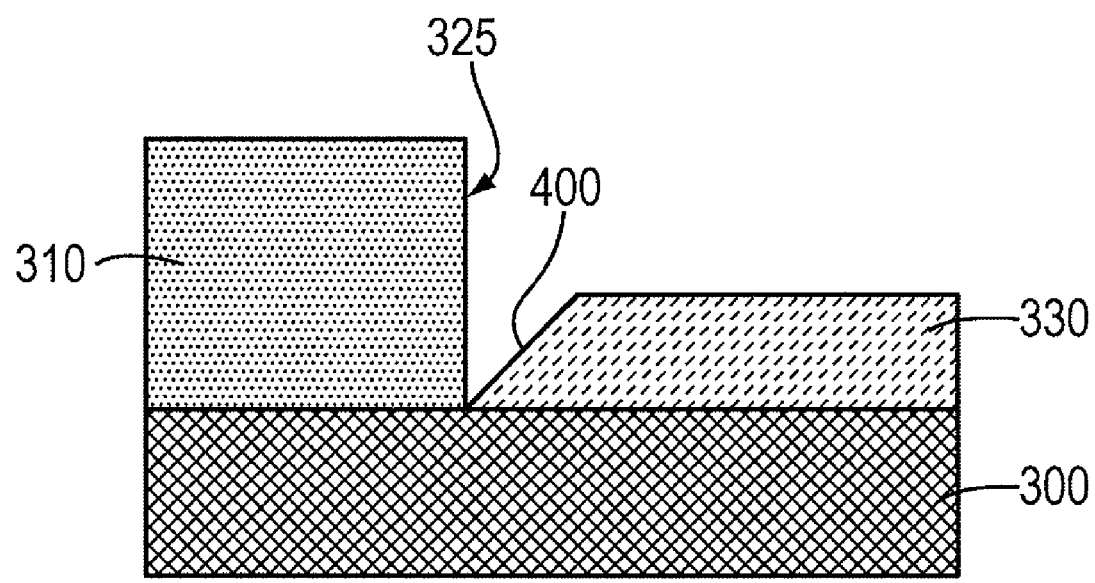
FIGS. 4 and 5 are schematic diagrams illustrating facet formation adjacent a dielectric sidewall.

When depositing a material such as Ge into a trench between $SiO_2$ sidewalls, the bond between a germanium atom and an oxygen atom requires higher energy than the bond between two Ge atoms. The Ge—O bond is therefore less favorable, and, accordingly, is less likely to form. Accordingly, under typical growth conditions, the Ge atoms form a facet 400, typically a {111} or {113} crystal plane, as shown in FIG. 4.

Figure 5:
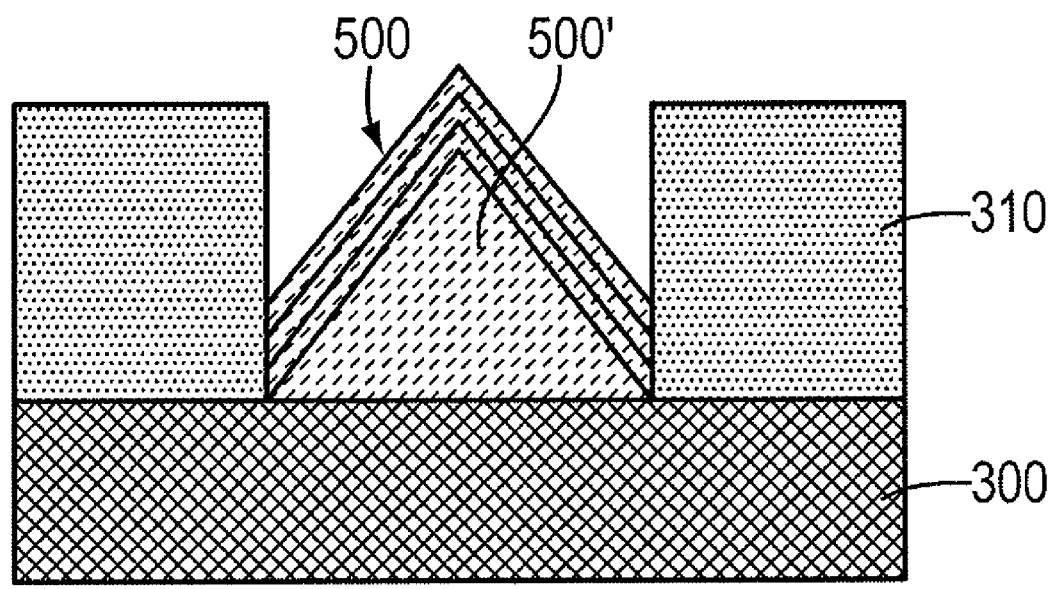

Between two dielectric sidewalls, two crystal planes, e.g., {111} plane 500, and {100} plane 500' may grow simultaneously. The growth rate of the two planes may be different. For example, in Ge the {100} plane grows faster than the {111} plane, as shown in FIG. 5. Eventually the fast growth plane disappears because the crystal growth in the direction of the fast plane is limited by the growth rate of the slow growth plane, as also shown in FIG. 5.

Figure 6:
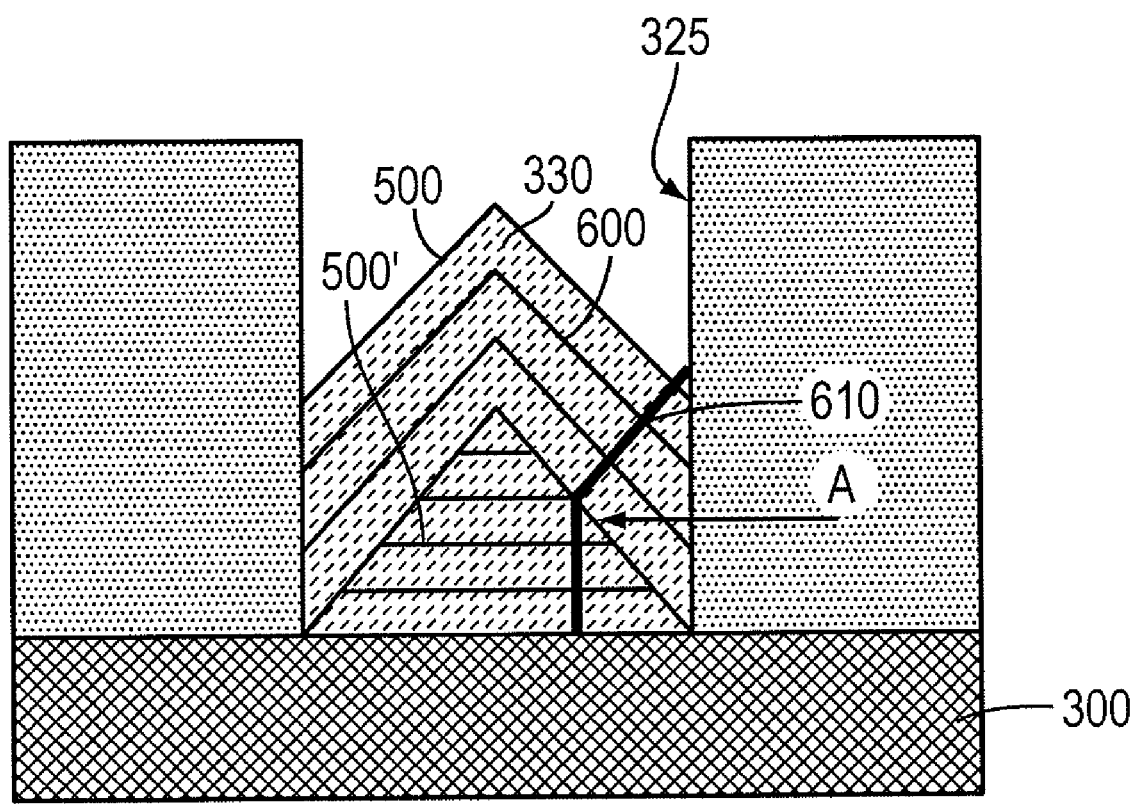
FIG. 6 is a schematic diagram illustrating growth planes of a material formed by employing ART.

To enable the observation of these two crystalline orientations, thin regions of a marker material defining a marker layer 600 may be interposed within the lattice-mismatched material 330. For example, thin Si—Ge regions, or "marker layers," may be interposed within a Ge matrix to provide contrast in TEM images. These marker layers 600 appear as black chevrons in the schematic representation of a TEM micrograph in FIG. 6. The Ge grows with a {100} crystal orientation in the lowest sector of the figure (below the letter A). Above that region, the angled black Si—Ge marker layers show that the Ge has transitioned to {111} growth planes or facets. The following behavior of a threading dislocation 610 is observed:

It rises vertically from the substrate 300 through the region with the {100} crystal orientation 500', toward the letter A.

At point A, the threading dislocation intersects the region with the {111} crystal orientation 500. The facets of the crystal direct the threading dislocation to a direction normal to the {111} facet, toward the sidewall.

The threading dislocation reaches the $SiO_2$ sidewall and terminates.

When the threading dislocation reaches a facet boundary, the crystal boundary typically redirects it in a direction perpendicular to the facet. The facet inclines the threading dislocation towards the sidewalls. All threading dislocations in a material having facets non-parallel to an underlying substrate, therefore, typically intersect a sidewall, if the sidewall is sufficiently high. In some embodiments, the aspect ratio of the trench, i.e., the ratio of its height to its width, is preferably greater than about 1. The sidewalls preferably trap the dislocations, leaving a defect-free region of epitaxial material at the top of the trench. This approach substantially eliminates substrate interface defects in one lithography and one selective epitaxial growth step.

Figure 7:
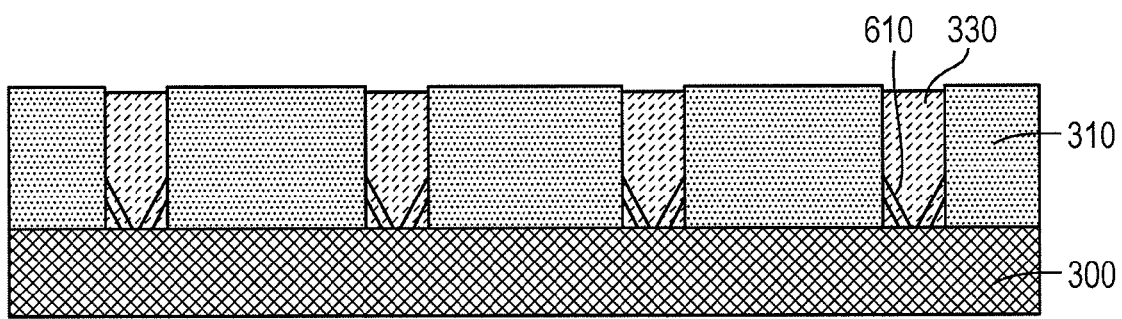
FIGS. 7-10 are schematic diagrams illustrating various samples formed by employing ART.
Figure 8:
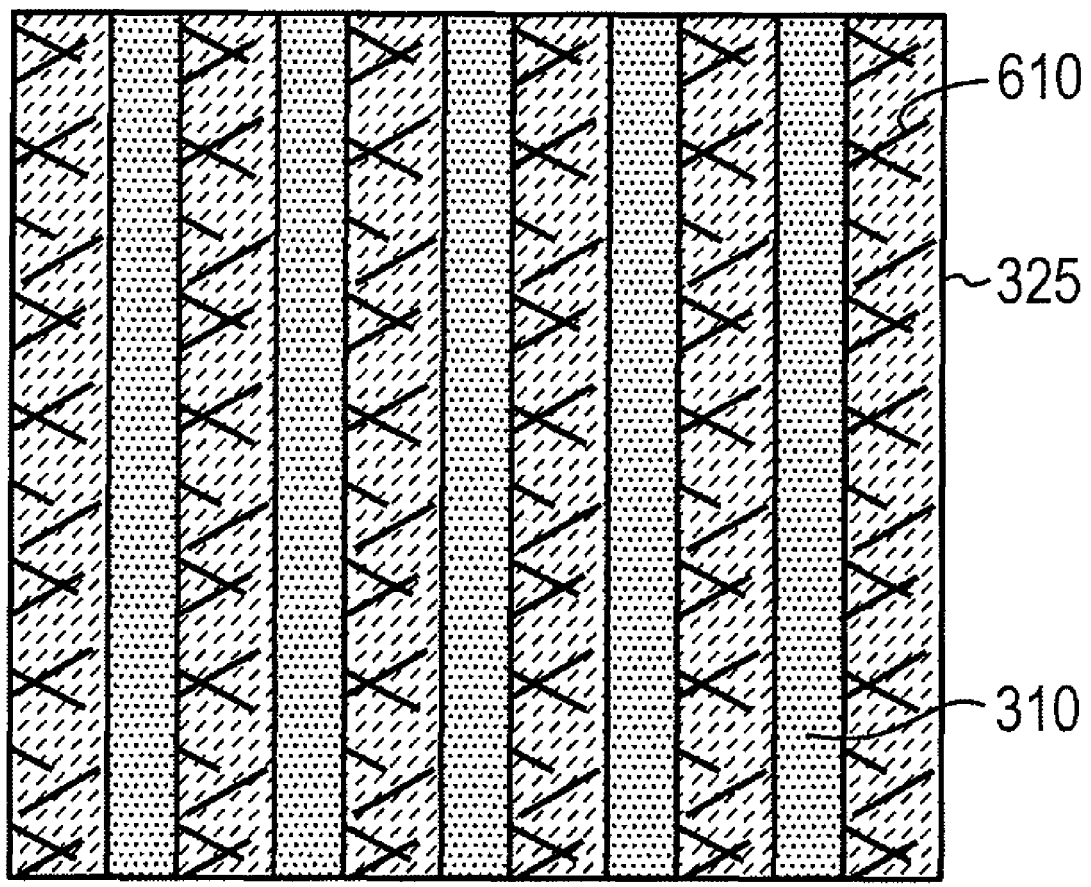

ART samples were prepared with Ge and GaAs. Ge was deposited on Si substrates within $SiO_2$ trenches. Thin TEM images of samples indicated that the $SiO_2$ sidewalls trapped all threading dislocations, leaving defect-free Ge at the top of the trenches. Referring to FIG. 7, a schematic diagram of a TEM image illustrates that Ge deposited in openings 320, e.g., trenches 200 nm wide, may be free of defects 610 above a trapping region. Top-view ("plan-view") TEM images of the material were then captured. FIG. 8, a schematic diagram based on a TEM micrograph, illustrates the trapping of threading dislocations by $SiO_2$ sidewalls 325, with the dislocations terminating at the sidewalls in the lower portion of the ART regions.

Figure 9:
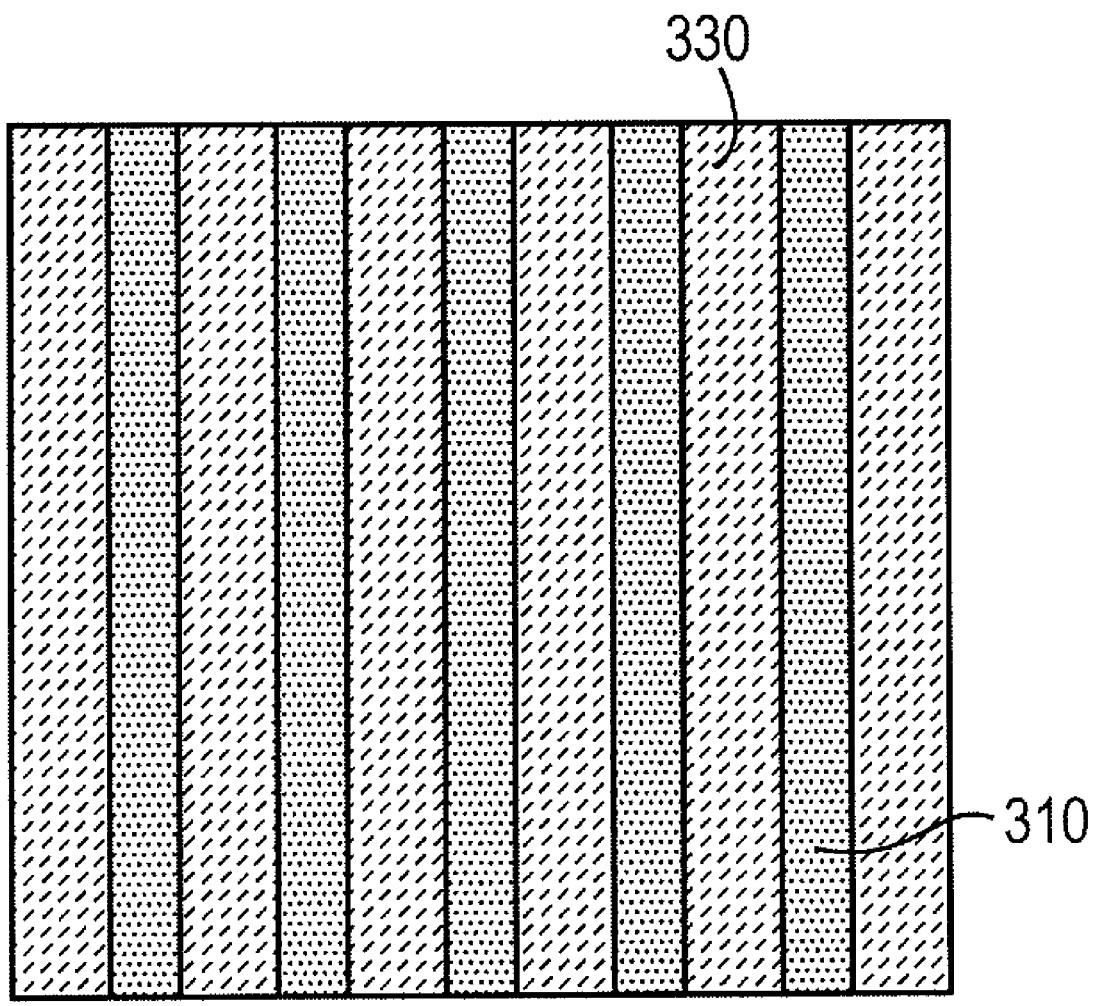

Referring to FIG. 9, a lower region of Ge containing the dislocations may be removed. The upper region, after removal of the substrate 300 and dislocation 610 regions, may be free of defects. The Ge in the upper regions may contain no threading dislocations due to lattice-mismatch, no stacking faults, no twins (two-dimensional lattice imperfections), and no cracks.

Figure 10:
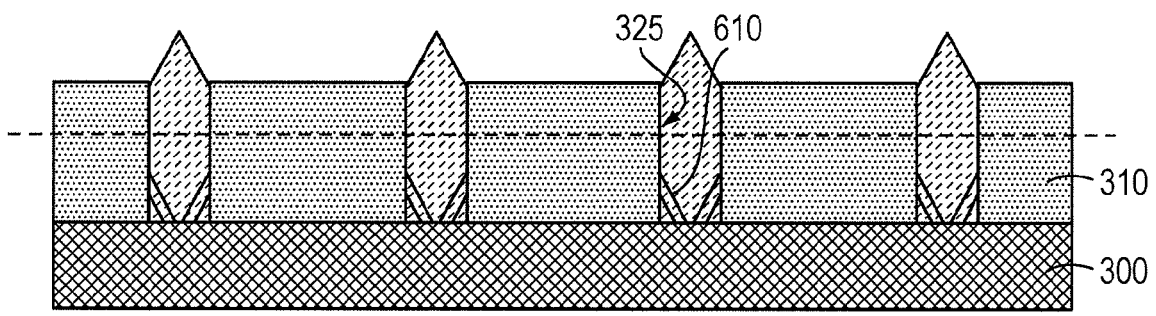

FIG. 10 illustrates trenches filled with a crystalline material, e.g., GaAs, between dielectric, e.g., $SiO_2$, sidewalls on substrate 300, e.g., Si. The threading dislocations 610 slant towards the sidewall 325 near the bottom of the trenches. The GaAs is free of defects above the dashed line. The use of ART has been confirmed for the deposition of high-quality III-V materials on Si substrates, thereby confirming its viability for creating high-efficiency, low-cost multi-junction solar cells on Si substrates.

Analysis has shown that mismatch of thermal expansion coefficients generally does not cause cracking when growing lattice-mismatched materials using ART. The absence of cracking may be due to one or more of the following:

The stresses are small because the epitaxial layers are thin.

The material may elastically accommodate stresses arising from thermal-expansion mismatch because the trenches are relatively narrow, in contrast to very wide trenches, in which material behavior may approximate that of a bulk film.

The dielectric material of the sidewall, e.g., $SiO_2$, tends to be more compliant than the semiconductor materials, and may serve as an expansion joint, stretching to accommodate the stress.

Figure 1:
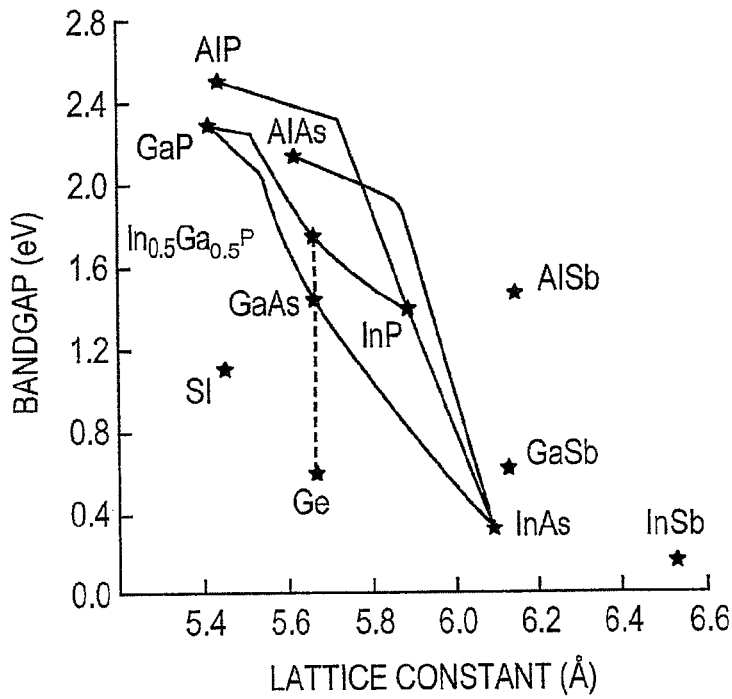
FIG. 1 is a graph illustrating the bandgaps and lattice constants of common lattice-matched III-V semiconductor materials.
Figure 2:
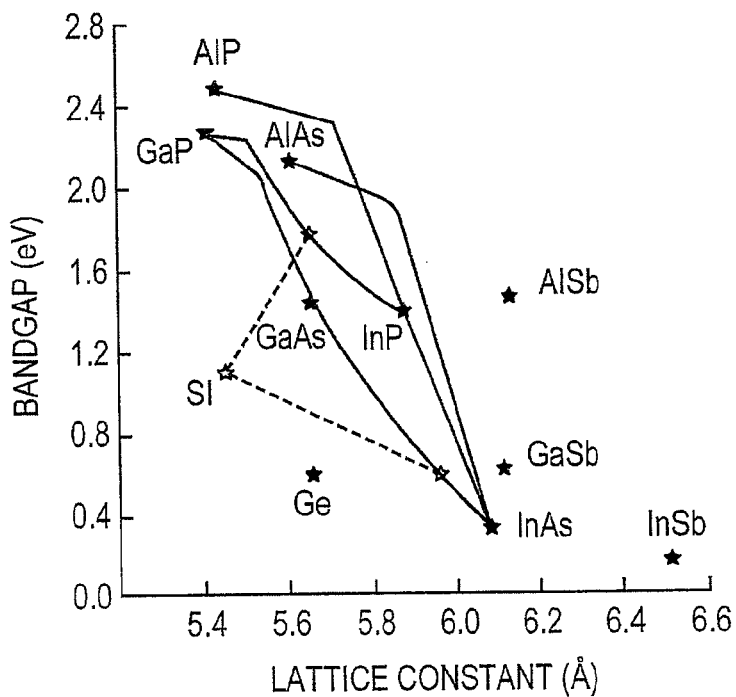
FIG. 2 is a graph illustrating selection of materials for a non-lattice-matched three-junction solar cell with bandgaps that provide a theoretical ability to convert solar energy to electricity with 63.2% efficiency.

Referring again to FIG. 2, the lattice and bandgap parameters of an embodiment of a solar cell with three junctions made from $In_{0.5}Ga_{0.5}P$ (1.86 eV), Si (1.15 eV), and $In_{0.7}Ga_{0.3}As$ (0.61 eV) are illustrated. This solar cell has a theoretical maximum efficiency of 63.2%. This figure indicates that a device using InGaP material with 50% indium and 50% gallium is shown, but other concentrations of indium and gallium may be used to tune the bandgap and lattice constant of the material to improve the solar cell performance. The same is true for the InGaAs layer; the bandgaps for 70% indium and 30% gallium are shown, but other fractions of indium and gallium may be used in the InGaAs layer to tune the bandgap and lattice constant for improved performance. For example, it may be desired to use an InGaAs layer lattice-matched to InP, as described below, and in this case, $In_{0.53}Ga_{0.47}As$ may be used.

Figure 11:
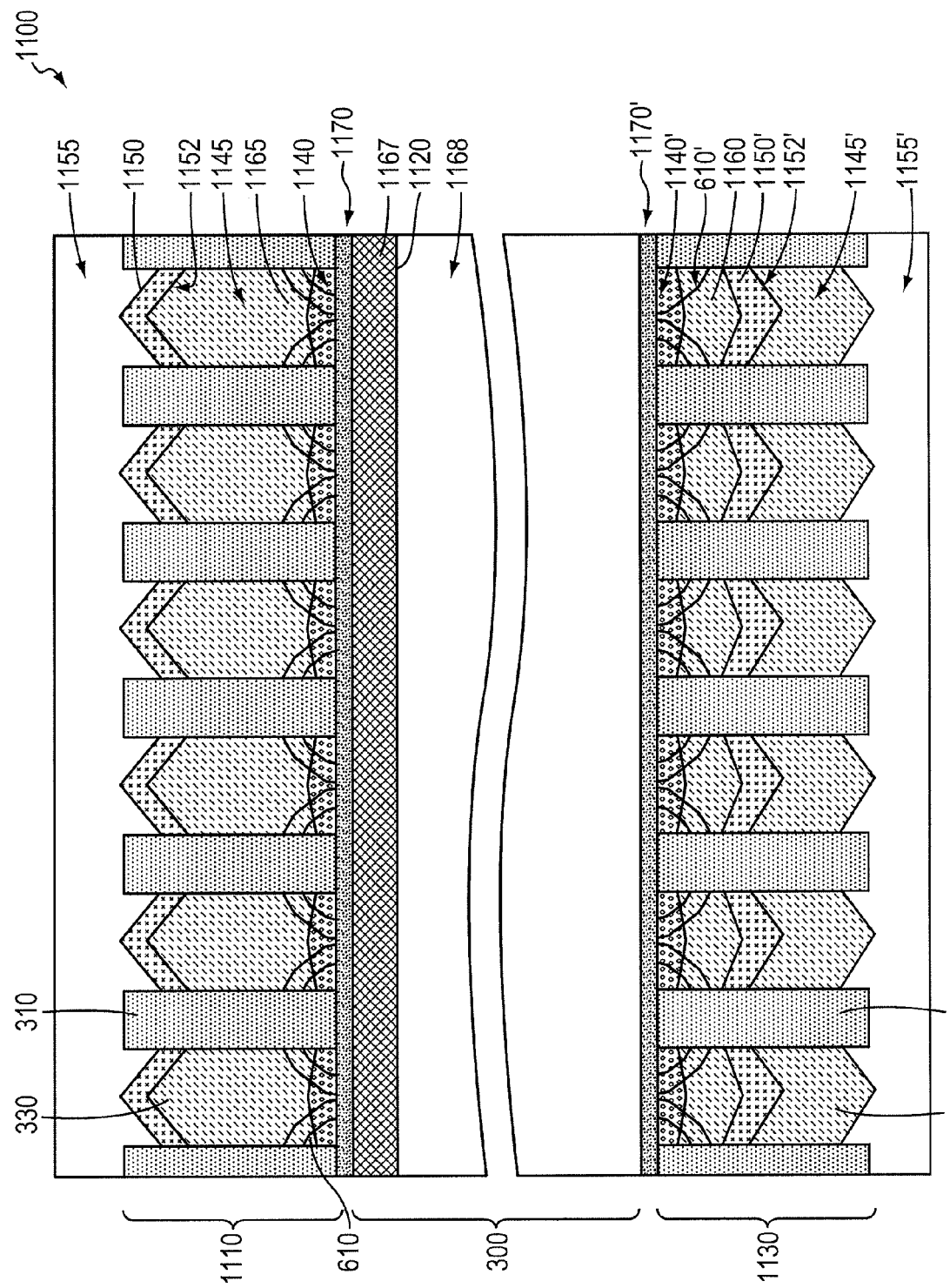
FIG. 11 is a schematic diagram illustrating a three-junction solar-cell structure.

FIG. 11 shows a three-junction solar-cell structure 1100 including a top ART region 1110 including InGaP regions with p-n junctions formed on the top of a silicon substrate 300 by ART, a p-n junction 1120 within the silicon substrate, and a bottom ART region 1130 including InGaAs regions with p-n junctions defined on the bottom surface of the silicon substrate by ART. The structure may incorporate tunnel junctions to make electrical contact between the three sub-cells, i.e., the top ART region, the substrate, and the bottom ART region.

In particular, the top ART region 1110 may function as a first defect-trapping layer including a first crystalline material 330 (e.g., InGaP) proximate and in contact with a first non-crystalline material 310 (e.g., $SiO_2$). The first crystalline material includes defects 610 arising from a lattice-mismatch of the first crystalline material to a first adjacent material (e.g., the Si substrate 300); the defects terminate at the first non-crystalline material 310. The top ART region 1110 may include a wetting layer 1140 of, e.g., $p^+$GaAs. The composition of the wetting layer 1140 is selected such that it forms a high-quality, continuous layer over the underlying material, e.g., Si, to allow the subsequent growth of the first crystalline material, e.g., InGaP. The top ART region may also include a base 1145 of, e.g., p InGaP, and an emitter 1150 of, e.g., $n^+$InGaP. InGaP may be selected because it has an appropriate bandgap. A photovoltaic junction 1152 is defined by the interface between the base 1145 and the emitter 1150. The InGaP material and In and Ga fractions are chosen so that the material has a bandgap of about 1.86 eV. This bandgap is chosen so that the top sub-cell absorbs high energy photons efficiently but allows lower energy photons to pass through undisturbed. The emitter is highly doped n-type to provide low resistance from the InGaP to the top contact metal. The base is lightly doped p-type so that the InGaP has a high minority-carrier lifetime, which is preferred so that electron-hole pairs do not recombine before they are separated by the p/n junction. The top ART region may have a thickness of e.g., about 1 to 5 μm. A top contact layer 1155, e.g., a conductive material such as NiAu, may be disposed over the top ART region.

The bottom ART region 1130 may function as a second defect-trapping layer disposed below the first defect-trapping layer; the second defect-trapping layer includes a second crystalline material 330' (e.g., InGaAs) proximate and in contact with a second non-crystalline material 310' (e.g., $SiO_2$). The second crystalline material includes defects 610' arising from a lattice-mismatch to a second adjacent material (e.g., the Si substrate); the defects terminate at the second non-crystalline material 310'. The bottom ART region 1130 may include a wetting layer 1140' of, e.g., $n^+$GaAs, a bottom trapping region 1160 of, e.g., $n^+$InP, an emitter 1150' of, e.g., $n^+$InGaAs, and a base 1145' of p InGaAs, with a photovoltaic junction 1152' defined by an interface between the emitter 1150' of, e.g., $n^+$InGaAs and the base 1145' of, e.g., p InGaAs. The bottom ART region 1130 may have a thickness of e.g., about 1 to 5 μm. A bottom contact layer 1155', e.g., a conductive material such as NiAu, may be disposed over the bottom ART region.

A solar cell, i.e., p-n junction 1120, may be disposed between the top and bottom defect-trapping layers, e.g., in the Si substrate, defined with $n^+$ and $p^+$ doping. The p-n junction may be defined, e.g., by an emitter 1167 of $n^+$Si formed by, for example, ion implantation, in a p-type Si substrate, with the remainder of the substrate defining a base 1168, the p-n junction 1120 being disposed between the emitter and the base.

A tunnel junction 1170 may be formed between the substrate 300 and the top ART region, and another tunnel junction 1170' may be formed between the substrate and the bottom ART region. A tunnel junction is a very highly doped $p^+/n^+$ diode. The doping is sufficiently high for current to tunnel between the $p^+$ and $n^+$ layers, with the tunnel junction forming a low resistance contact between two adjacent layers. In other words, the doping is sufficiently high such that the $p^+/n^+$ junction depletion region is small enough for tunneling to occur when the top ART region is exposed to light and, therefore, current flows through the top ART region. The current forward biases the tunnel junction. The tunnel junctions may be formed in III-V materials formed above and below the semiconductor substrate 300. By in-situ doping during growth, high $p^+$ and $n^+$ doping of such layers may be achieved, e.g., above approximately $1\times10^{19}/cm^3$. A preferred tunnel junction may be selected such that a depletion region thickness is about 10 nm. As illustrated, in an embodiment, tunnel junctions 1170, 1170' may be defined in the top and bottom portions of a Si substrate 300. Then the doping in the silicon starting from the top of the silicon substrate may be as follows:

| | |
|---|---|
| $p^{++}$ (tunnel junction) | 1170 |
| $n^{++}$ (tunnel junction) | 1170 |
| $n^+$ (emitter) | 1167 |
| p (base) | 1168 |
| $p^{++}$ (tunnel junction) | 1170' |
| $n^{++}$ (tunnel junction) | 1170' |

A structure may include additional solar cells disposed, e.g., below the second defect-trapping layer or above the first defect-trapping layer. In some embodiments, both the first and the second defect-trapping layers are disposed above a substrate.

In various embodiments, a large array (500,000 on a 12-inch substrate) of trenches 300 nm to 500 nm wide covers the surface of each die on a Si substrate. In other embodiments, the trench width can vary over a broader range, such as from 180 nm to 5 μm. The distance between the trenches may be about 150 nm, below the wavelength of almost all of the solar radiation. This configuration may prevent solar radiation from passing between the trenches; therefore, the cell may absorb almost all of the incident light. While the 150 nm spacing is preferable for some criteria, the spacing may be substantially adjusted, based on application and/or material requirements.

The ART based 3-junction solar-cell structure shown in FIG. 11 operates as follows.

Sunlight first strikes the InGaP material 330 of the top ART cell 1110. InGaP absorbs photons with an energy of 1.82 eV or higher. Photons with an energy below 1.82 eV pass through the InGaP and enter the Si Substrate 300.

The photons that pass through the InGaP enter the top defect-trapping region 1165. Preferably, absorption in this region is avoided or reduced because photogenerated carriers may recombine at the threading dislocations 610. Because most of the top trapping region is created from InGaP, the trapping region will be transparent to the photons not absorbed by the region of InGaP above. While a wetting layer 1140 of GaAs is provided to facilitate two-dimensional growth of InGaP above the Si, this layer is kept very thin to reduce absorption of photons passing through to the Si. Those of skill in the art will understand how to apply other materials to decrease absorption by the wetting layer.

Si absorbs photons with an energy of 1.15 eV or higher. Photons with an energy below 1.15 eV pass through the Si substrate 300.

The photons that pass through the Si enter a second trapping region, i.e., bottom trapping region 1160. Again, the goal is to avoid absorption in this region because photogenerated carriers may recombine at the threading dislocations. Therefore, the trapping region is preferably created from InP, a high-bandgap material. The low-energy (≦1.15 eV) photons pass through the InP trapping into the InGaAs region. Since InP grows in a non-planar mode on Si, a thin GaAs wetting layer is preferably formed on the Si to grow two-dimensional layers of InP. The GaAs does not absorb the low-energy photons in this region because it has a wide bandgap.

The InGaAs will then absorb photons with an energy of 0.61 eV or higher, and the p-n junction in the InGaAs will separate the photogenerated electron-hole pairs.

As described above, light will pass through a trapping region in an ART solar cell. Dislocations may cause absorption of sub-bandgap photons, but this sub-bandgap absorption does not significantly affect the performance of an ART-based cell.

In the trapping regions, threading dislocations create electron states within the bandgap. The material therefore absorbs some percentage of the sub-bandgap photons that pass through the trapping regions. Since the photogenerated carriers appear near threading dislocations, they tend to recombine non-radiatively and, i.e., without contributing to the solar cell's output power. It is possible to estimate the impact of this loss mechanism with the following equation that gives the transmission T as a function of the absorption coefficient (and the thickness t:

$$T = e^{-\alpha t}$$

It has been reported that the absorption coefficient of InP and GaAs regions grown on silicon is approximately $5 \times 10^3$/cm for photons with energies between 0 and 0.5 eV below the bandgap. For devices in which the thickness of the highly dislocated regions is about 100 nm, which may be typical for ART trenches having a width on the order of 500 nm or less, the transmission through the trapping regions is expected to be about 95%.

It is possible to estimate the effect of this phenomenon on the efficiency of the three-junction solar cell described herein. The InGaP absorbs about 33% of the photons before any of them enter a trapping region. The remaining 67% of the photons enter the trapping regions in the InGaP cell. The trapping regions in the InGaP cell nominally absorb about 5% of that 67%, or about 3.3% of all the incident solar photons.

The remaining photons then pass through the silicon cell before they enter the trapping region in the InGaAs cell. By this time, the two upper (InGaP and Si) cells have absorbed about 67% of all the incident solar photons. Only 33% of the total incident solar photons reach the trapping region in the InGaAs cell. The trapping regions nominally absorb about 5% of that 33%, or about 1.7% of all the incident solar photons.

In total, then, the trapping regions absorb ~3.3%+~1.7%=~5% of all the incident photons. These simple calculations indicate that photon absorption in sub-bandgap regions near the threading dislocations may be a minor loss mechanism that may prevent ART solar cells from attaining their maximum theoretical efficiency of 63%, but does not preclude a production efficiency in excess of 50%.

The use of ART in solar cells may reduce the detrimental effect of dislocations. In bulk material, a dislocation can induce recombination over a relatively long distance, e.g., up to about 10 μm. The use of ART to make solar cells in trenches 300 to 500 nm wide reduces the sphere of influence of a defect significantly in comparison to a defect's influence in a bulk material or a film, since a dislocation cannot induce recombination in an adjacent trench.

The formation of InGaP and InGaAs on silicon using ART is an important part of the fabrication process used to create the triple junction cell shown in FIG. 11. Techniques for forming InGaP and InGaAs on silicon using ART are now described in greater detail.

Figure 12:
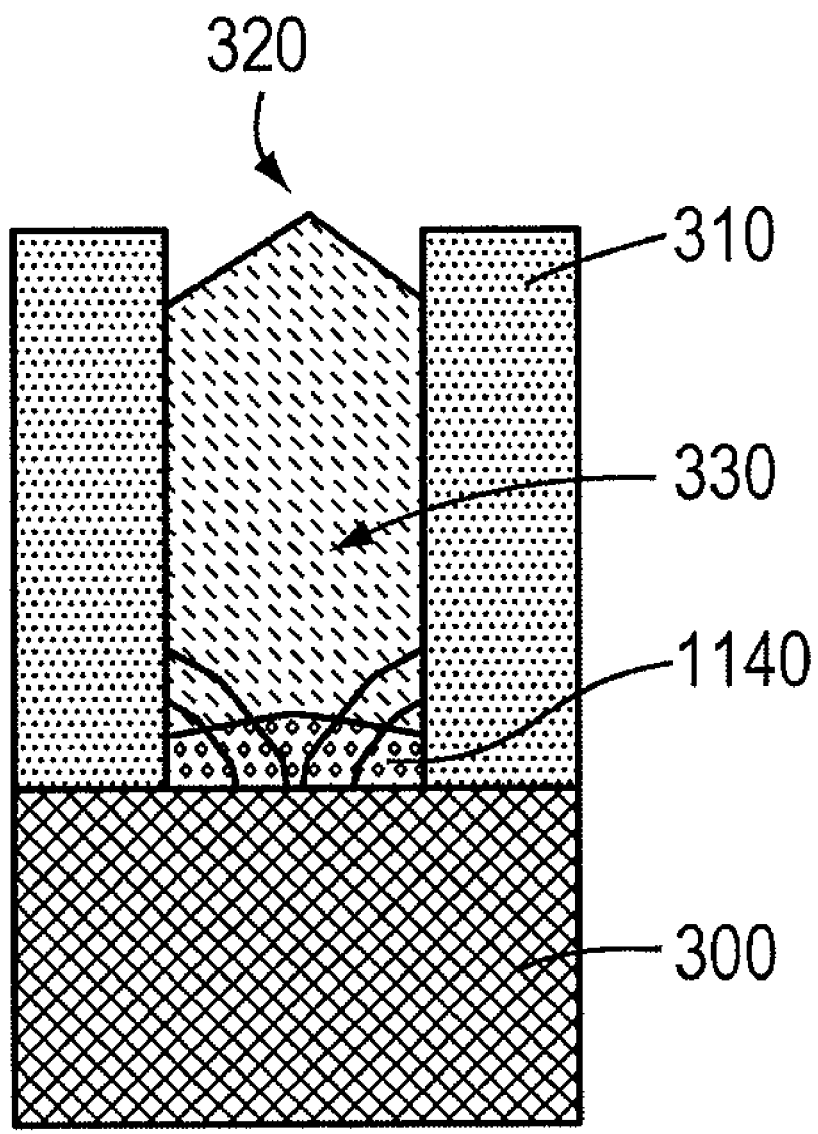
FIG. 12 is a schematic diagram illustrating an ART structure for growing InGaP.

FIG. 12 illustrates an embodiment of an ART structure for growing InGaP. A suitable Si substrate 300 may be obtained, for example, from ATDF, a subsidiary of SEMATECH. Illustratively, p-type Si (001) substrates are offcut by 6° to avoid anti-phase domain boundaries. A relatively thick dielectric layer 310, e.g., a thermal oxide having a thickness of 1 to 1.5 μm, is formed on the substrate. A trench 320 having a width of, e.g., 0.2 to 2.5 μm, is patterned in the thermal oxide by photolithography and dry etching.

After the patterning step, fluorocarbon residue may be removed from the substrate surface by an oxygen plasma ashing step (800 W at 1.2 Torr for 30 minutes in an oxygen plasma asher. The residue removal may be performed in, e.g., an ASPEN STRIP II system manufactured by Mattson Technology, Inc., based in Fremont, Calif. The patterned substrate is cleaned, for example in Piranha, SC2, and dilute HF solutions sequentially. Epitaxial lattice-mismatched material 330 is selectively formed in the trench by, e.g., metal-organic chemical vapor deposition (MOCVD). The epitaxial lattice-mismatched material 330 may include InGaP disposed over a wetting layer 1140 of GaAs.

Figure 13:
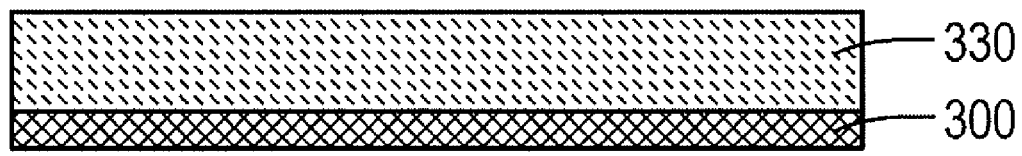
FIG. 13 is a schematic diagram illustrating various growth modes of lattice-mismatched materials.
Figure 13:
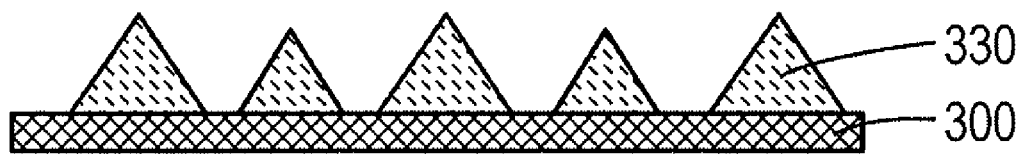
Figure 13:
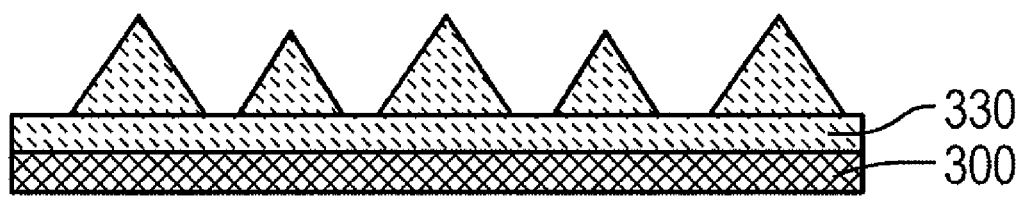

FIG. 13 shows three possible growth modes of lattice-mismatched material 330. In the Frank-Van der Merwe (FM) mode, the material 330 grows over a substrate 300 in two dimensions, layer by layer. In the Volmer-Weber (VW) mode, interfacial energies cause isolated patches of epitaxial material 330 to grow and then coalesce. In the Stranski-Krastanov (SK) mode, the material 330 grows layer by layer until it reaches a critical thickness, and then it grows in patches.

InGaP tends to grow on Si in a non-planar mode, i.e., in either the second (VW) or third (SK) mode. Non-planar growth (i.e., VW or SK mode) typically leads to high concentrations of defects and a rough surface. In some embodiments, this issue is addressed by depositing a wetting layer 1140 of, e.g., GaAs directly onto the Si substrate before depositing the InGaP. The GaAs will grow in 2D layers on Si, and InGaP will grow in 2D layers on GaAs. Table 2 shows an exemplary set of conditions that may be adjusted for growing GaAs and InGaP.

TABLE 2

Initial Conditions for Deposition of GaAs Wetting Layer and InGaP

| Material | Precursor Gases | Carrier Gas | Substrate Temp. (° C.) | Reactor Pressure (Torr) | V-III Ratio | Growth Rate (nm/min) |
|---|---|---|---|---|---|---|
| GaAs | Triethyl Gallium (TEG), Arsine | $H_2$ | 330-400 | 50-100 | 50-100 | 6 |
| InGaP | Trimethyl Indium (TMI), TMG, Phosphine | $H_2$ | 650-720 | 50-100 | 200-300 | 30 |

The V/III ratio is defined as the ratio between the flow rate of a group V element in the group V precursor to the flow rate of the group III element in the group III precursor, and may be calculated as (V precursor flow rate/III precursor flow rate)*

(fraction of V element in V precursor/fraction of III element in III precursor). In summary, the V-III ratio is equal to the number of group V atoms/second that enter a processing chamber divided by the number of group III atoms/second that enter the processing chamber.

Growth conditions may be adjusted in a variety of ways, such as, for example:

A pre-epitaxy bake of the substrate, e.g., in a temperature range of 800° to 1000° C.

During growth, thermal cycle anneal at temperatures from room temperature to 800° C.

To mitigate potential stacking fault defects as a result of thermal expansion coefficient mismatches between different materials such as InGaP, Si, and $SiO_2$, treat one or more of the materials to change its thermal expansion properties, e.g., subject the $SiO_2$ to a thermal nitrogen treatment to render its thermal expansion coefficient closer to that of Si.

In some embodiments, such as the three-junction solar-cell structure depicted in FIG. 11, a high-bandgap InP trapping region may be interposed between the Si substrate and the InGaAs to avoid photon absorption in the trapping region of the lowest solar cell. The bandgap of the trapping region is preferably significantly higher than the bandgap of the sub-cell below the trapping region. If photons are absorbed in the trapping region, they do not convert into electrical energy because they recombine in the dislocations in the trapping region. If the trapping region bandgap is large, photons tend to pass through it and are absorbed efficiently by an underlying the sub-cell.

While in the foregoing discussion, InP, rather than another high-bandgap material is interposed, because InGaAs is nearly lattice-matched to InP, those of skill in the art will appreciate how to apply other suitable materials.

Figure 14:
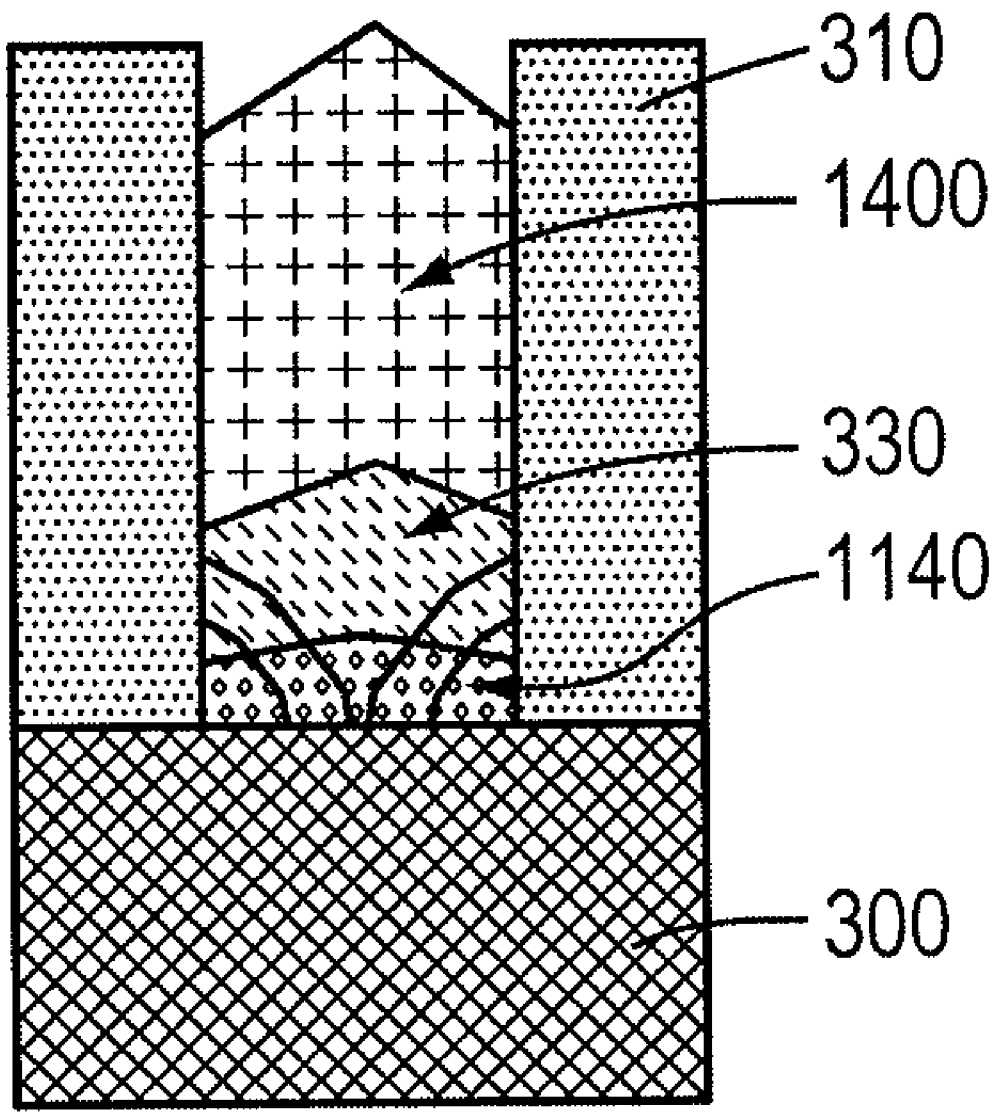
FIG. 14 is a schematic diagram illustrating growth of wide bandgap InP below InGaAs in an ART region.

FIG. 14 illustrates a structure in which a first crystalline material 330, e.g., wide bandgap InP, is formed over a GaAs wetting layer 1140 disposed in a trench 320. Subsequently, another crystalline material 1400, e.g., InGaAs, is formed over the first crystalline material, e.g., InP. InP is used to trap defects, and has a large bandgap, so light is not absorbed in it. The InGaAs functions as a solar cell. Table 3 sets forth an exemplary set of conditions that may be adjusted for growing InP and InGaAs.

TABLE 3

Initial Conditions for Deposition of InP and InGaAs

| Material | Precursor Gases | Carrier Gas | Substrate Temp. (° C.) | Reactor Pressure (Torr) | V-III Ratio | Growth Rate (nm/min) |
|---|---|---|---|---|---|---|
| InP | TMI, $PH_3$ | $H_2$ | 620-720 | 70 | 100-200 | 30 |
| InGaAs | TMI, TMG, $AsH_3$ | $H_2$ | 550-580 | 70 | 100-250 | 30 |

Figure 15:
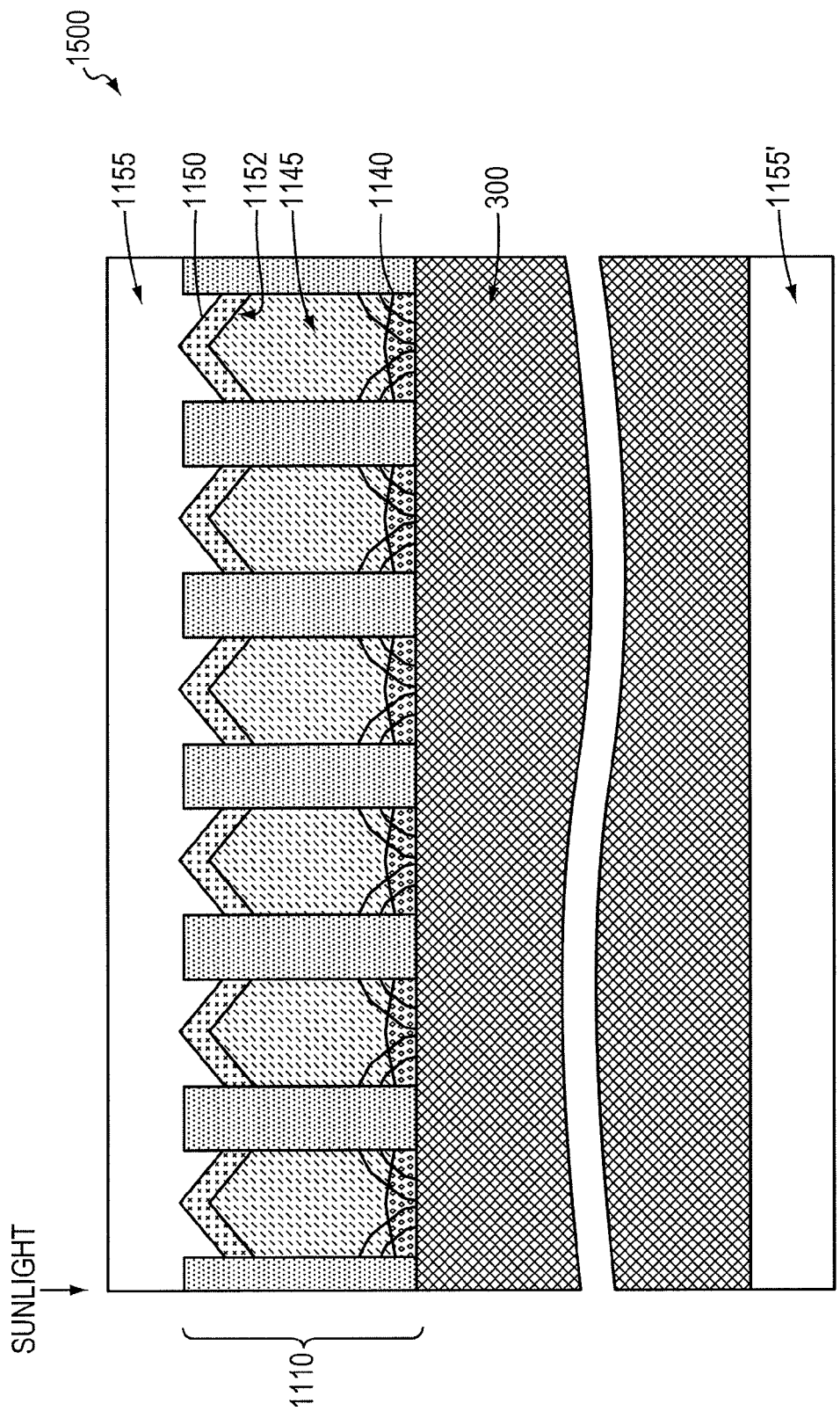
FIG. 15 is a schematic diagram illustrating a structure for a single-junction InGaP solar cell.

FIG. 15 shows an exemplary architecture for a single-junction InGaP solar cell 1500. Note that FIG. 15 and other drawings of solar cells herein are schematics, rather than precise drawings. They omit, for example, contact doping regions, window layers, and back surface field layers, whose presence would be readily apparent to those of skill in the art.

The single-junction solar cell 1500 includes a top ART region 1110, as discussed with reference to FIG. 11, and $p^+$GaAs wetting layer 1140 disposed in a trench 320 over a $p^+$Si substrate 300. A base layer 1145 of p InGaP is disposed over the wetting layer, and an emitter layer 1150 of $n^+$InGaP is disposed over the base layer, defining a photovoltaic junction 1152 therebetween. The top ART region may have a thickness of e.g., about 1 to 5 µm. A top contact layer 1155, e.g., a conductive material such as NiAu, may be disposed over the top ART region. A bottom contact layer 1155', e.g., an Al layer, may be formed on the side of the Si substrate opposite the top ART region. The metals for the top and bottom contact layers are preferably selected to provide a low contact resistance with the adjacent semiconductor material. For example, aluminum provides a low contact resistance with doped silicon but not with III-V materials. Thus, aluminum is preferably used as a contact layer adjacent to doped silicon. The Si substrate 300 may be doped $p^+$ and have a thickness of about 200 to 700 µm, with a preferred thickness of about 300 µm. Sunlight may impinge on the single-junction solar cell 1500 through the top contact layer 1155.

Trench widths, the layer thicknesses, and the doping levels may be varied to increase efficiency. In some embodiments, the InGaP thickness is between about 1 to 1.5 µm. Those of skill in the art will recognize how to adjust the geometrical structure of the device, the doping levels, and the material coefficients, without under experimentation for a particular application.

Figure 16:
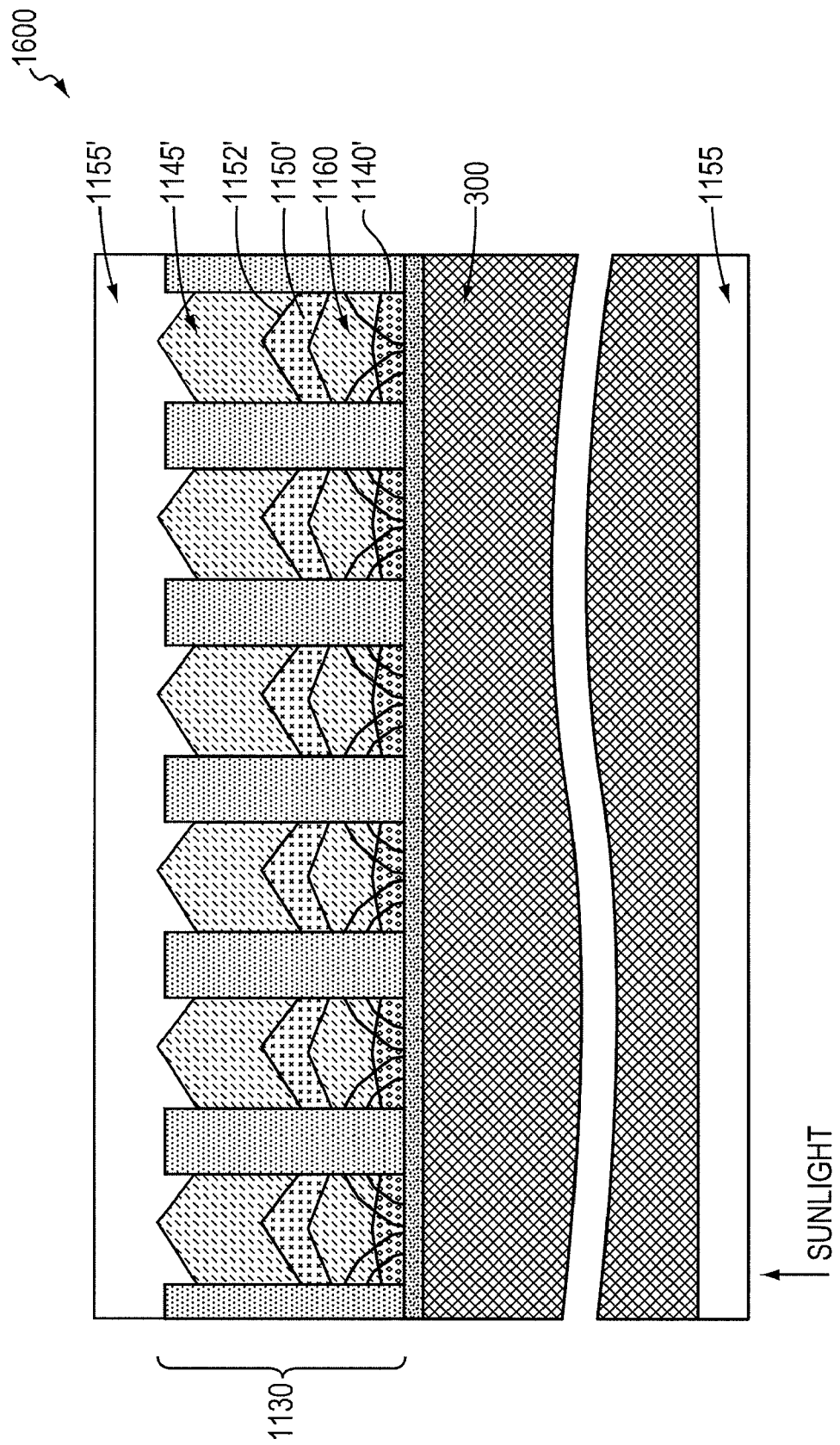
FIG. 16 is a schematic diagram illustrating an architecture for a single junction InGaAs solar cell.

FIG. 16 shows an architecture for a single-junction InGaAs solar cell 1600. As with the InGaP solar cell, trench widths, layer thicknesses and doping levels may be tailored to increase efficiency.

The single-junction InGaAs solar cell 1600 includes a bottom ART region 1130, as discussed with reference to FIG. 11, formed on an $n^+$Si substrate 300. The bottom ART region 1130 may include a wetting layer 1140' of, e.g., $n^+$GaAs, a bottom trapping region 1160 of, e.g., $n^+$InP, an emitter 1150' of, e.g., $n^+$InGaAs, and a base 1145' of p InGaAs, with a photovoltaic junction 1152' defined by an interface between the emitter 1150' and base 1145'. The bottom ART region 1130 may have a thickness of e.g., about 1 to 5 µm. A bottom contact layer 1155', e.g., a conductive material such as NiAu, may be disposed over the bottom ART region. A top contact layer 1155, e.g., an Al layer, may be formed on the side of the Si substrate opposite the bottom ART region. Sunlight may impinge on the single-junction solar cell 1600 through the top contact layer 1155.

In some embodiments the InGaAs thickness is between about 1 to 3 µm. The bottom ART region 1130 may have a thickness of 1-5 µm. The substrate may have a thickness of about 300 µm. Those of skill in the art will readily appreciate how to adjust the geometrical structure of the device, the doping levels, and the material coefficients to optimize device performance for a particular application.

Figure 17:
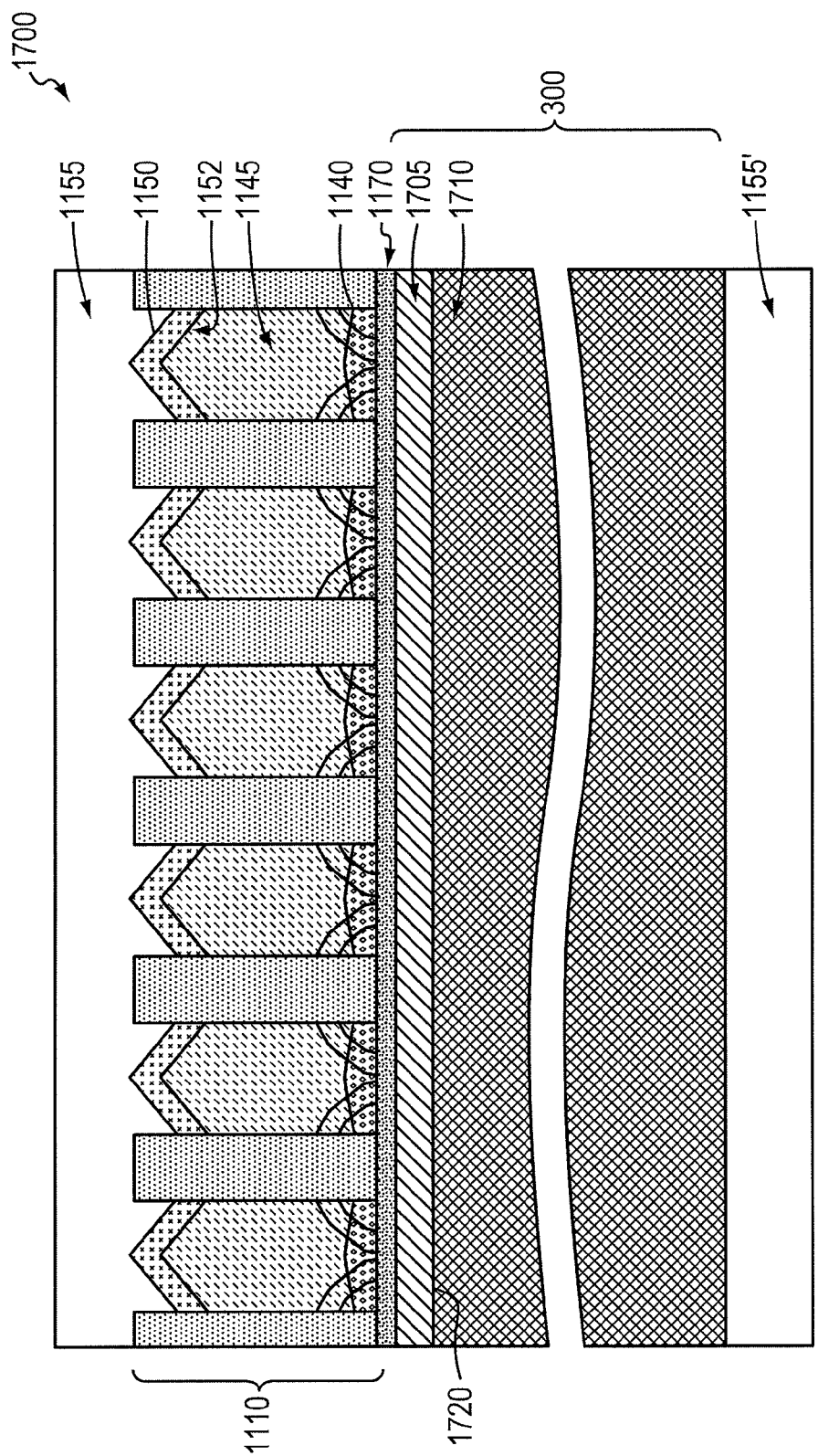
FIG. 17 is a schematic diagram illustrating a dual-junction InGaP/Si solar cell.
Figure 18:
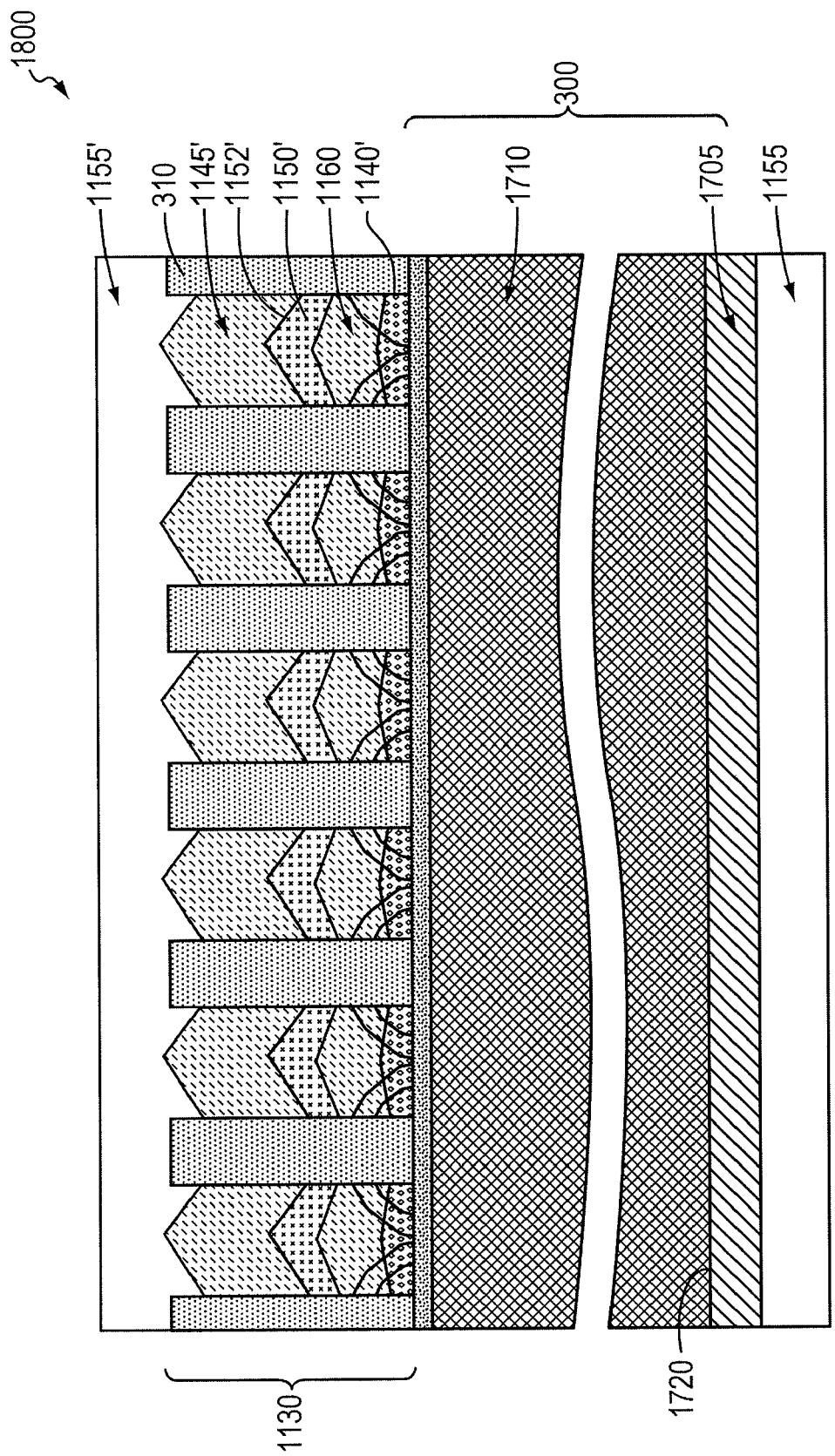
FIG. 18 is a schematic diagram illustrating a dual-junction InGaAs/Si solar cell.

FIG. 17 illustrates an embodiment of a dual-junction InGaP/Si cell 1700 and FIG. 18 illustrates an embodiment of a dual-junction InGaAs/Si cell 1800. The dual-junction InGaP/Si solar cell 1700 includes a top ART region 1110 as described with reference to FIG. 11 and having a first photovoltaic junction 1152, disposed over a substrate 300 defining a second junction. In particular, the substrate may be p-type Si, having a thickness of about 300 µm. An emitter region 1705 of $n^+$Si may be formed in the substrate 300 by ion implantation. A base 1710 may be defined by the remainder of the substrate 300. Thus, a second photovoltaic junction 1720 is formed between the emitter 1705 and the base 1710. A tunnel junction 1170 may be disposed between the top ART region 1110 and the emitter 1705. A bottom metal layer 1155', e.g., Al, is formed on a backside of the substrate 300. The top ART region 1110 may be formed adjacent to the emitter 1705.

The dual junction solar cell 1800 of FIG. 18 includes a first photovoltaic cell including a first semiconductor material having a first lattice constant and a first bandgap energy, e.g., Si. The first photovoltaic cell corresponds to the Si substrate 300, which includes an emitter 1705 of n$^+$Si, a base 1710 of p-type Si, and a photovoltaic junction 1720. A second photovoltaic cell includes a second semiconductor material having a second lattice constant different from the first lattice constant and a second bandgap energy lower than the first bandgap energy. The second photovoltaic cell may be formed adjacent to the base 1710 in, e.g., InGaAs, in a bottom ART region 1130, as described with reference to FIG. 11. In particular, the second photovoltaic cell may include an emitter 1150' of n$^+$InGaAs and a base 1145' of p InGaAs, with a junction 1152' formed at the interface between the emitter and the base.

A defect-trapping layer 1160 is disposed between the first and second photovoltaic cells. The defect-trapping layer includes, e.g., n$^+$InP, a material having a third bandgap energy higher than the second bandgap energy. The defect-trapping layer includes a crystalline material (e.g., InP) proximate a non-crystalline material 310 (e.g., SiO$_2$), with the crystalline material including defects terminating at the non-crystalline material.

Figure 19:
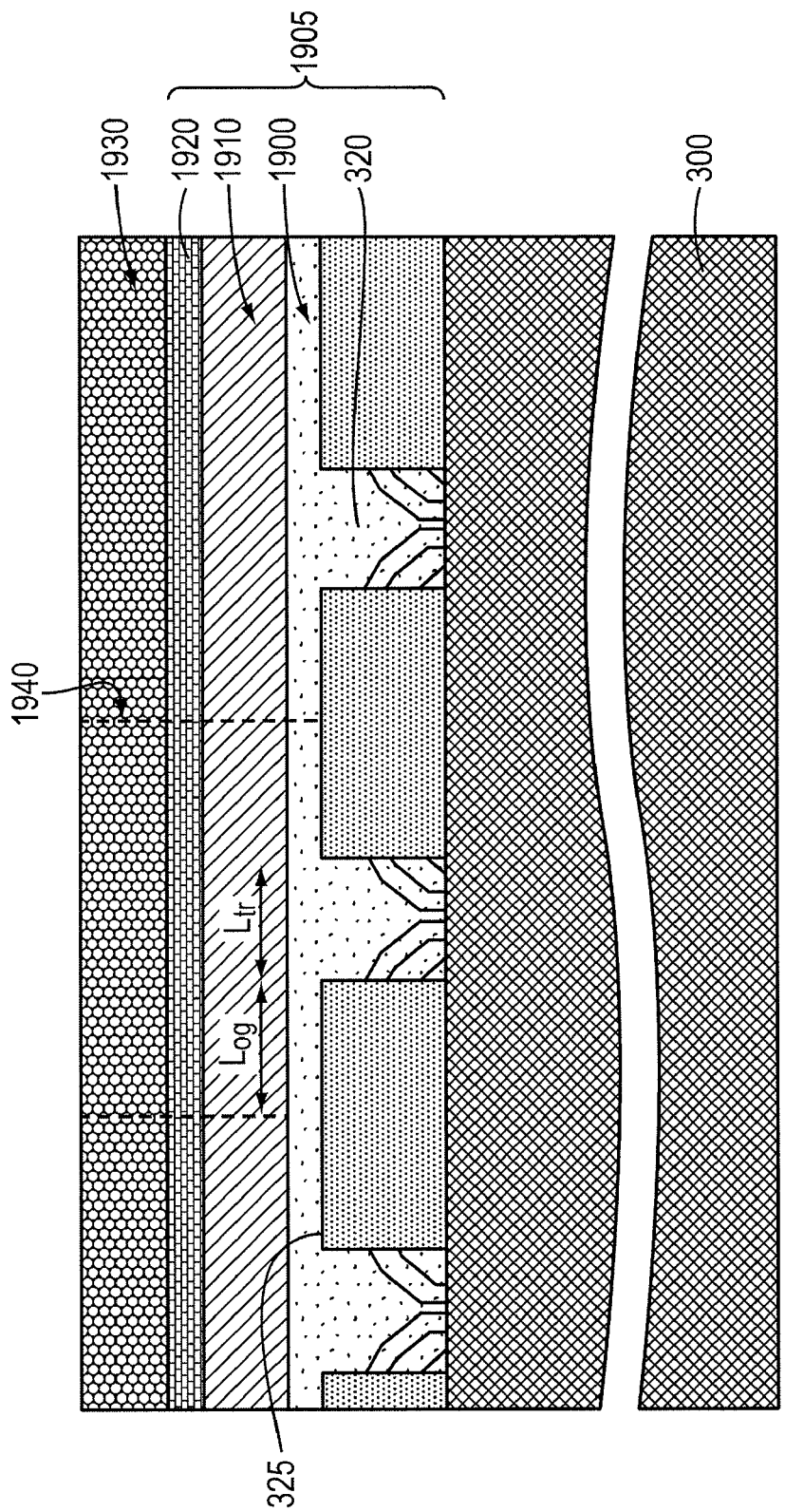
FIG. 19 is a schematic diagram illustrating an alternative architecture for a single junction InGaAs solar cell utilizing a coalesced material.

In an alternative to the structures illustrated in FIGS. 15 and 16, a solar cell architecture may include a film that is grown until it overflows the trench 320, as illustrated in FIG. 19, to create an ART buffer layer 1900. The illustrated embodiment depicts a single-junction ART solar cell 1905 incorporating the ART buffer layer 1900. Adjacent discrete regions of lattice-mismatched material coalesce to form a single continuous film, i.e., the ART buffer layer 1900. A solar cell p-n junction is then grown on the buffer layer. The solar cell p-n junction may include a base 1910 and an emitter 1920, with a metal 1930 disposed thereover. The total thickness of the emitter, base, and dielectric layer may be about 1 to 5 μm. The structure may be formed on a substrate 300, e.g., Si, having a thickness of approximately 300 μm. In embodiments based on ART buffer layers, as illustrated by the example of FIG. 19, sidewall recombination does not diminish the solar cell performance because the active regions of the solar cell do not reside in the trench 320.

FIG. 19 also illustrates a coalescence defect 1940, the vertical dotted line emerging from the top of a SiO$_2$ sidewall 325. These types of defects may appear in a selectively grown epitaxial film above a certain percentage of the SiO$_2$ pedestals, which may vary as a function of deposition conditions. Exemplary methods to reduce the density of these coalescence defects include:

adjusting the MOCVD conditions, and
reducing the density of the coalescence regions that may give rise to defects. To reduce the density of those regions, the length of the overgrowth area (L$_{og}$ in FIG. 19) may be increased, which means increasing the width of the SiO$_2$ pedestals.

As L$_{og}$ increases, a smaller percentage of the lower-energy light passing into the Si and InGaAs areas has to pass through the trapping regions. As a result, this architecture is less vulnerable to sub-bandgap light absorption by dislocations within the trapping regions.

In some embodiments, the ART buffer layer is formed from the primary solar cell material; e.g., InGaP on the top and InGaAs on the bottom. Before growing other materials on the buffer layer, it may be desirable to planarize the buffer layer 1900. Tailoring of key parameters for a planarization process employing chemical-mechanical-polishing (CMP) for InGaP and InGaAs may include selecting:

a slurry that attacks the surface and weakens chemical bonds, the size and material of the abrasive particles,
the hardness of the pad,
the down force,
the rotational speed,
the duration of the treatment, and
a suitable post-CMP cleaning step.

Figure 20:
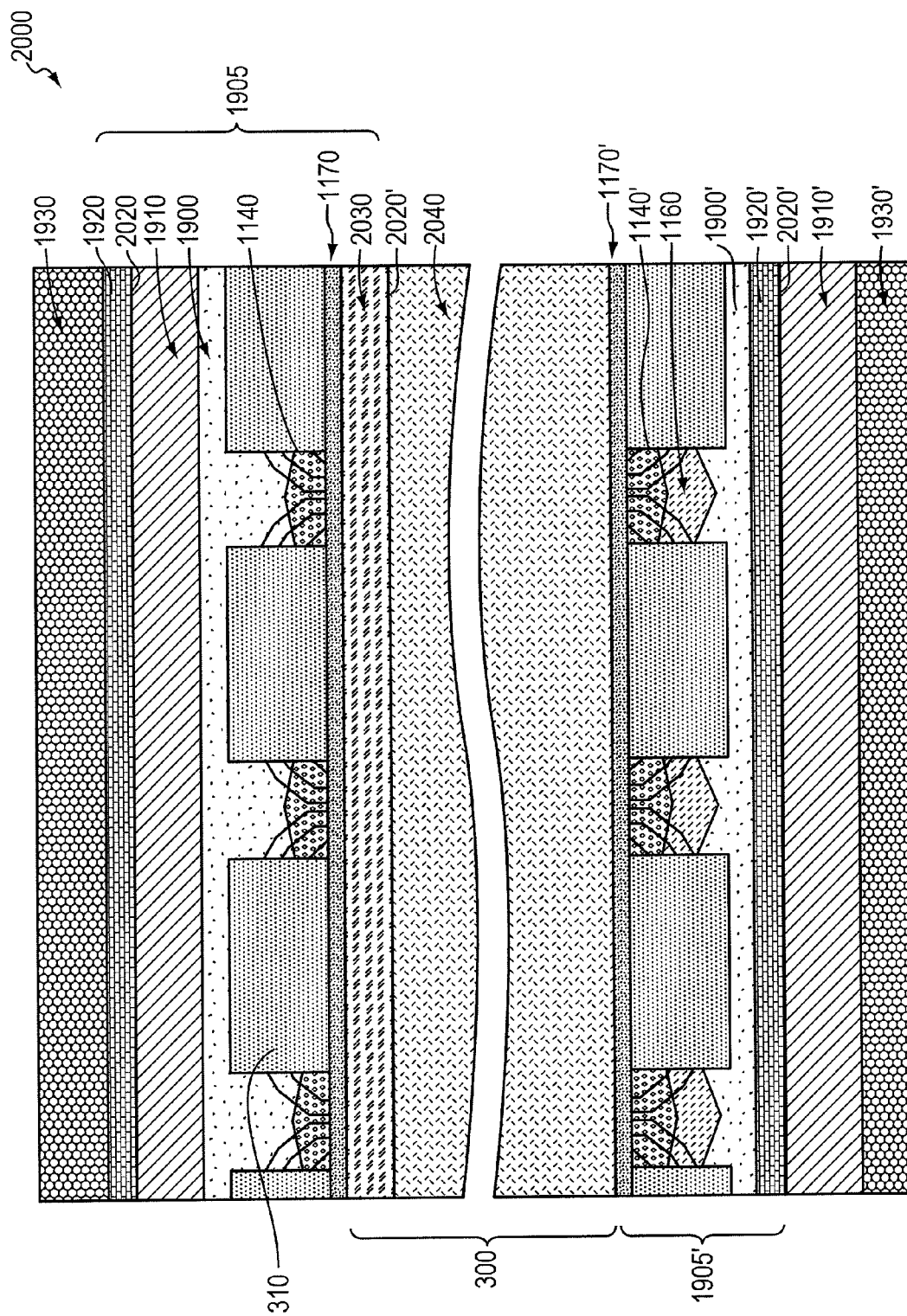
FIG. 20 is a schematic diagram illustrating an alternative embodiment of a InGaP/Si/InGaAs cell with a coalesced buffer region.
Figure 21A:
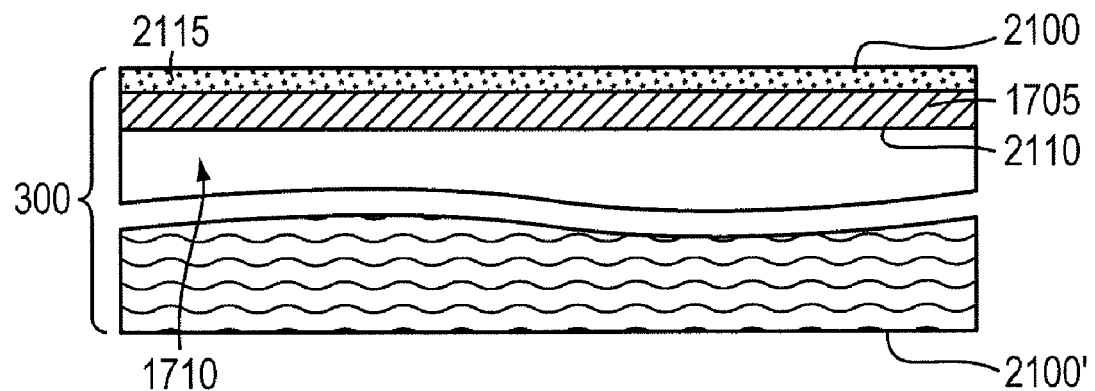
FIGS. 21*a*-21*j* are a series of schematic diagrams illustrating the fabrication of a three-junction InGaP/Si/InGaAs solar cell.
Figure 21B:
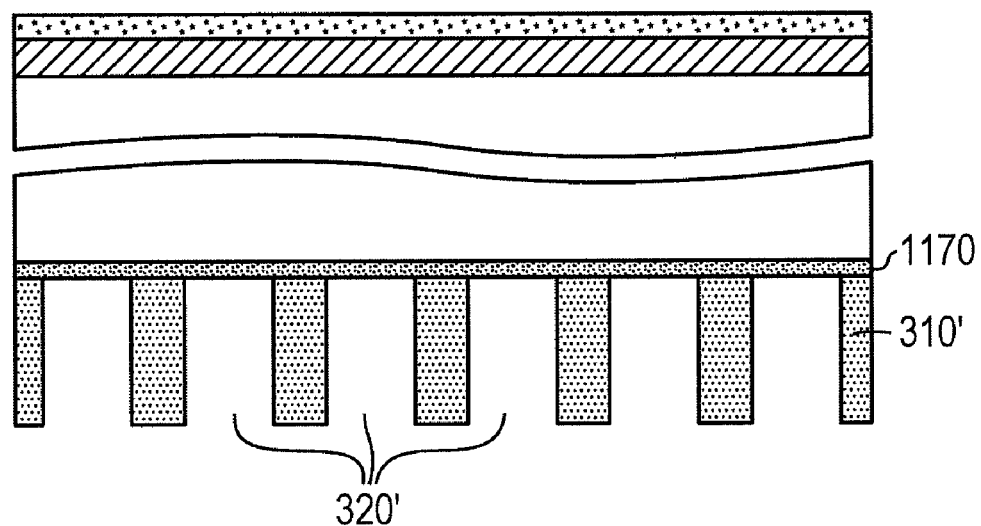
Figure 21C:
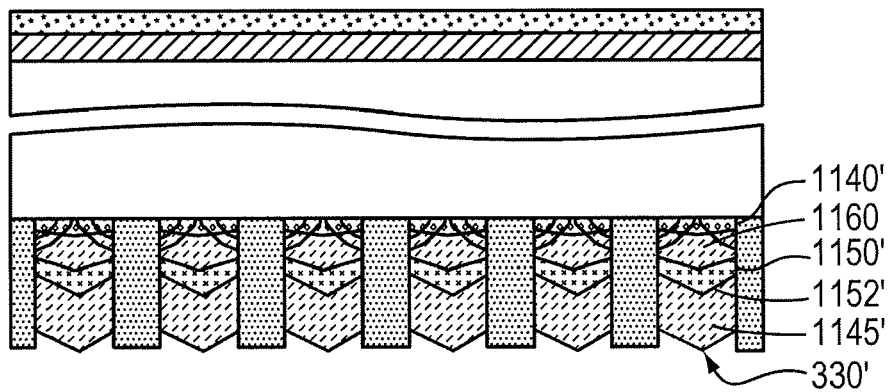
Figure 21D:
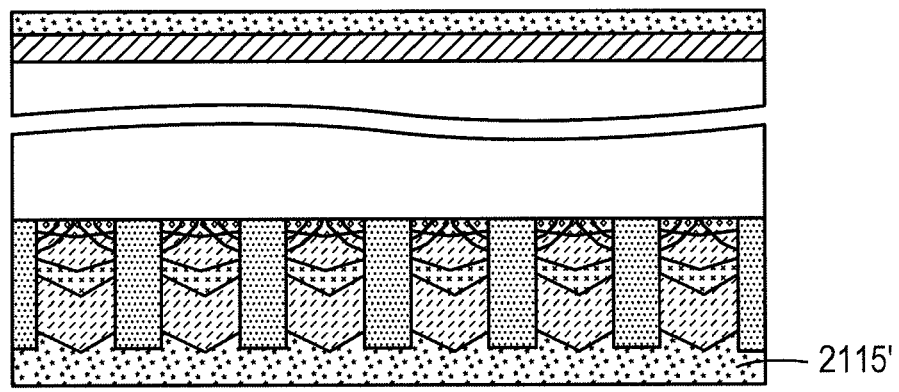
Figure 21E:
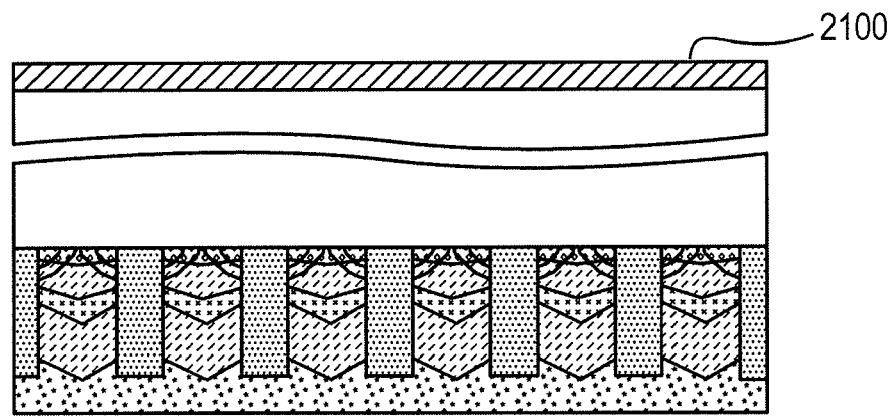
Figure 21F:
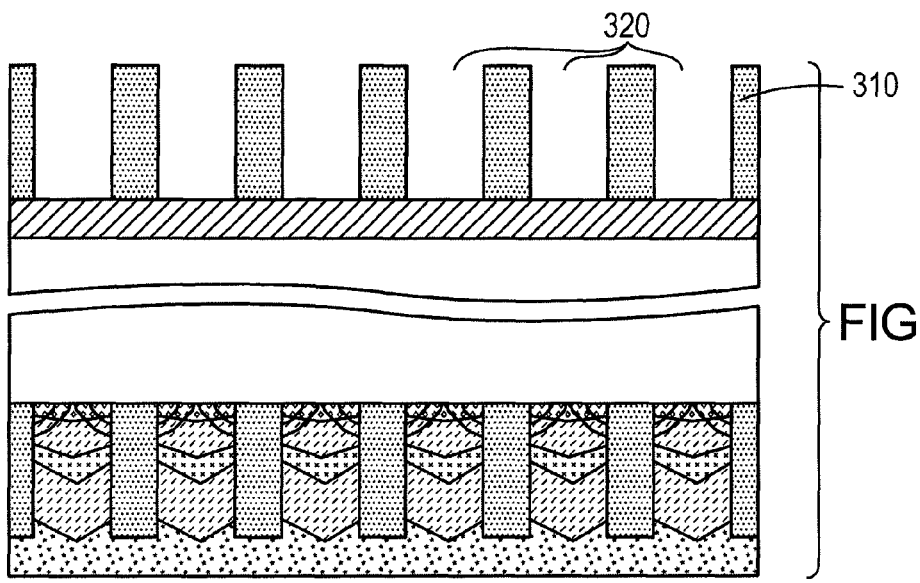
Figure 21G:
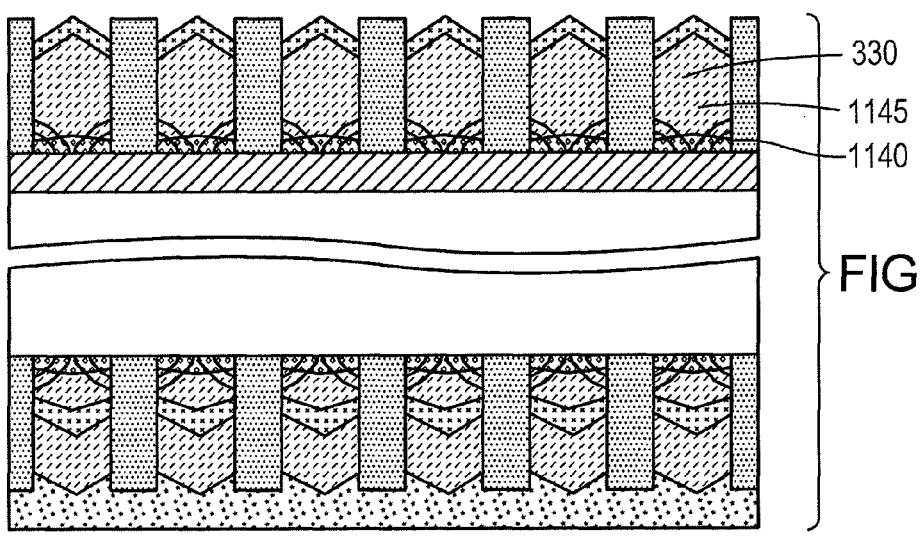
Figure 21H:
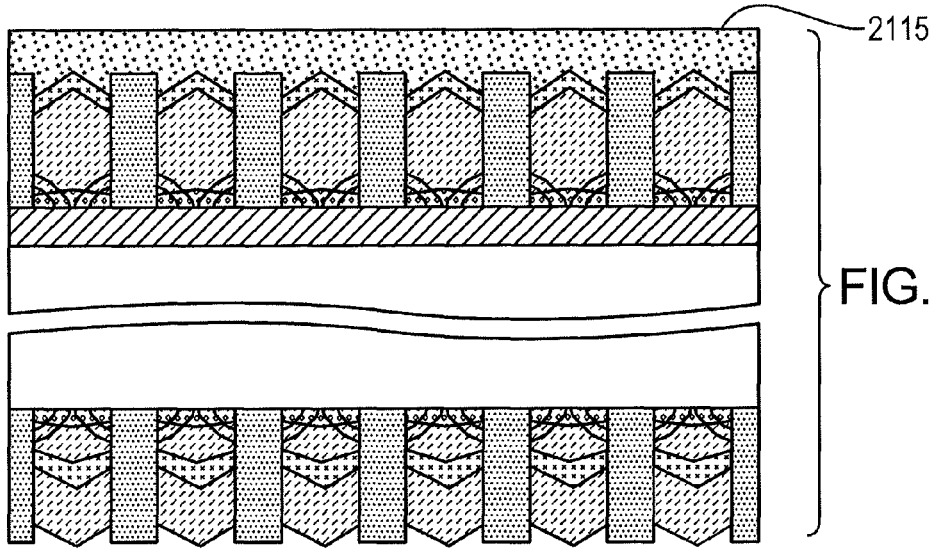
Figure 21I:
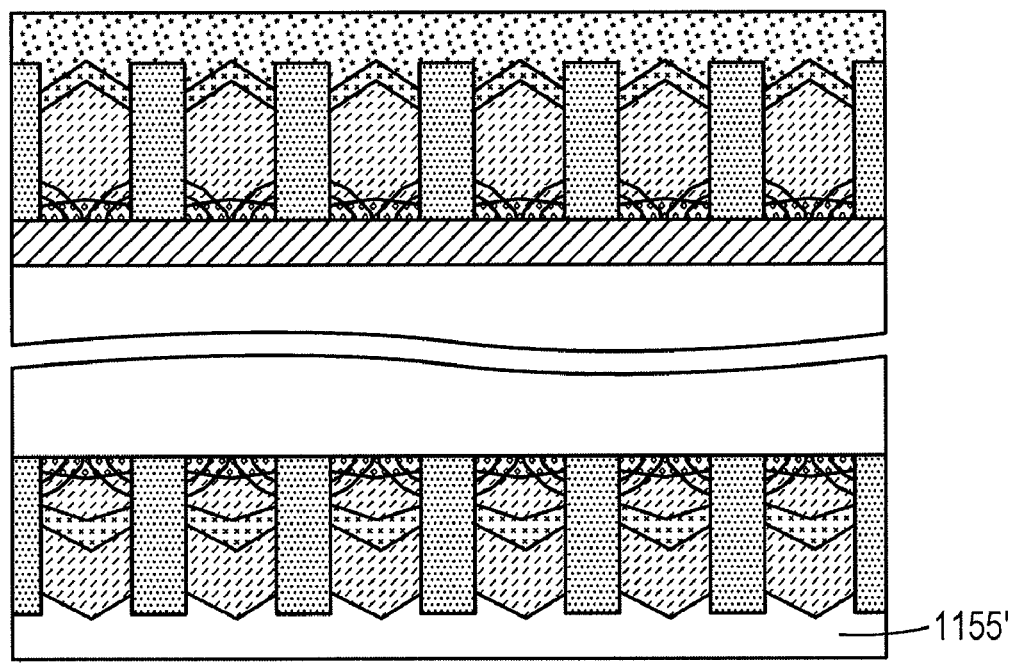
Figure 21J:
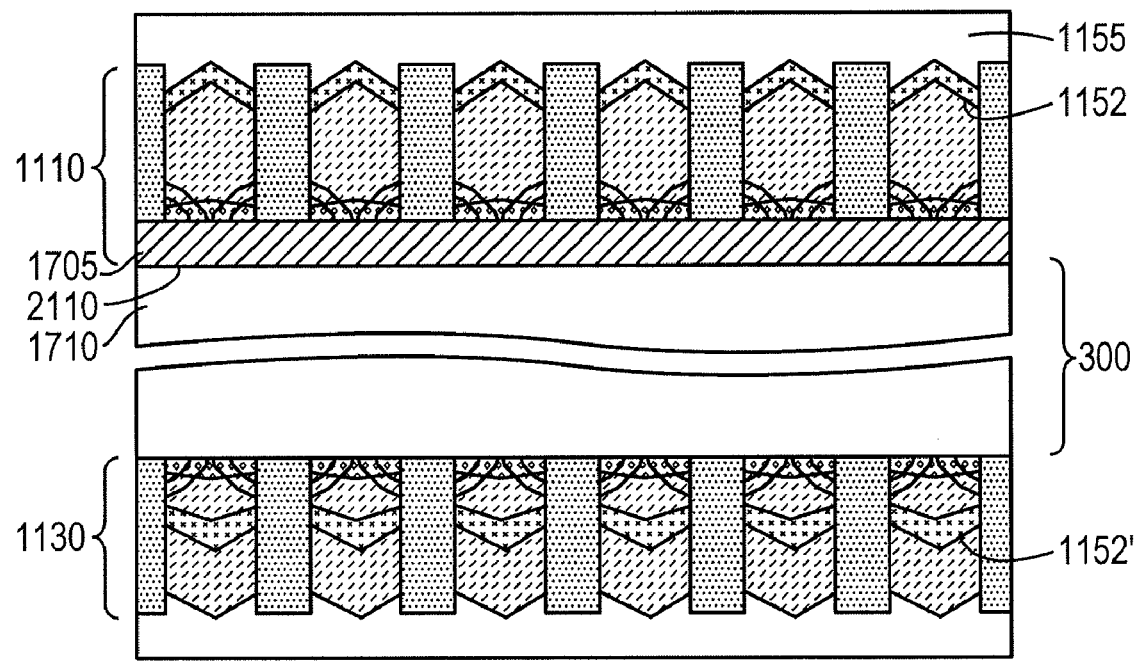

FIG. 20 shows an alternative embodiment that uses a coalesced buffer region to form a three junction InGaP/Si/InGaAs cell 2000. A single junction ART solar cell 1905 incorporates a ART buffer layer 1900 that includes p InGaP disposed over a wetting layer 1140 of p$^+$GaAs formed in an opening defined in a dielectric material 310. A base 1910 of, e.g., p$^+$InGaP is disposed over the buffer layer 1900, and an emitter 1920 of e.g., n$^+$InGaP is disposed over the base, with a photovoltaic junction 2020 being formed at the interface between the emitter layer 1920 and the base 1910. The single junction ART solar cell 1905 may have a thickness of e.g., 1 to 5 μm. A metal 1930 of, e.g., NiAu, is disposed over the single junction ART solar cell 1905.

The single junction ART solar cell 1905 is formed over a substrate 300 of, e.g., p-type Si, having a thickness of about 700 μm. An emitter region 2030 of, e.g., n$^+$Si, is defined in the substrate, with the remainder of the p-type Si substrate defining a base 2040. Thus, a second photovoltaic junction 2020' is defined by an interface between the emitter 2030 and the base 2040. Tunnel junctions 1170, 1170' are formed on the top and bottom surfaces of the semiconductor substrate 300.

Finally, a second single-junction ART solar cell 1905' is disposed over a backside of the substrate 300, adjacent the base 2040. The cell 1905' includes a third photovoltaic junction 2020', disposed between an emitter 1920' of n$^+$InGaAs and a base 1910' of p-type InGaAs. An ART buffer layer 1900' may be formed over a trapping layer 1160' of n+InP that is disposed over a wetting layer 1140' of n$^+$GaAs.

Referring to FIGS. 21a-21j, an exemplary process for fabricating a three-junction InGaP/Si/InGaAs solar cell includes the following steps:

1. A crystalline semiconductor substrate 300 having a top surface 2100 and a bottom surface 2100', e.g., an 8- or 12-inch Si substrate, is provided. The substrate may be p-type, with an n$^+$region emitter 1705 implanted through the top surface, thereby defining an n$^+$/p solar cell junction 2110 between the emitter 1705 and the base 1710 (defined by the remainder of the substrate 300). Alternatively, the n$^+$ region emitter may be formed by epitaxial growth. The doping level for the n$^+$ emitter may be relatively high, e.g., greater than $1 \times 10^{19}$/cm$^3$, while the doping level for the base may be relatively low, e.g., less than $1 \times 10^{16}$/cm$^3$. A top protective layer 2115, e.g., a layer of SiN$_x$ having a thickness of e.g., 200 nm, is formed on the top substrate surface 2100.

2. The bottom surface 2100' or backside of the substrate is implanted with a p-type dopant, e.g., boron at a dose of $1 \times 10^{14}$ to $2 \times 10^{15}$/cm$^2$, preferably $1 \times 10^{15}$/cm$^2$, with an 5 to 20 keV energy, preferably 10 keV, 7° tilt, to form a thin p$^+$ region, and then an n-type dopant, e.g., arsenic at a dose of $2 \times 10^{15}$/cm$^2$ to $5 \times 10^{15}$/cm$^2$, preferably $5 \times 10^{15}$/cm$^2$, with an energy of 10 to 60 keV, preferably 20 keV, 7° tilt, thereby defining a tunnel junction 1170. The dose, and energy of the two implants should be optimized so that the voltage drop across the tunnel junction is minimized for a given current. The n$^+$ region is preferably shallow so that it does not compensate the deeper p$^+$ region.

3. A bottom insulator layer 310' is formed proximate the bottom surface 2100' of the substrate by, e.g., depositing a 1 to 5 μm layer of SiO$_2$ on the backside of the substrate by CVD. A plurality of bottom openings 320', i.e., ART trenches, are formed through the bottom insulator layer by creating ART trenches in the SiO$_2$ are formed by lithography and dry etch.

4. A second crystalline layer, i.e., a second lattice-mismatched material 330' is formed within the bottom openings by, e.g., growing an n$^+$GaAs/InP buffer layer with a thickness between 10 nm and 1 micron (~400 nm) (including wetting layer 1140' and trapping layer 1160) and a p- and n-type InGaAs cell layer (1 to 5 μm) (including an emitter 1150' and base 1145', with photovoltaic junction 1152' disposed therebetween) in one step in the same MOCVD reactor. The second crystalline layer is lattice-mismatched to the crystalline semiconductor substrate. A majority of defects arising at a surface of the second crystalline layer nearest the crystalline semiconductor substrate terminate within the respective bottom openings.

5. A bottom protective layer 2115', e.g., a layer of SiN$_x$ having a thickness of about 200 nm, is deposited on the back side of the structure by CVD.

6. The top protective layer 2115 is removed from the top surface 2100 of the substrate by, e.g., dry etching. The substrate is cleaned with a suitable wet clean, e.g., piranha (sulfuric acid, H$_2$O$_2$, and water) and an HF etch.

7. A top insulator layer 310 is formed proximate the top surface of the substrate by, e.g., depositing a 1 to 5 μm layer of SiO$_2$ on the top surface of the substrate by CVD. A plurality of top openings 320 are defined in the top insulator layer by, e.g., the creation of ART trenches in the SiO$_2$ by lithography and dry etch.

8. A first lattice-mismatched material 330, i.e., a first crystalline layer, is formed within the top openings 320 by, e.g., growing a GaAs wetting layer 1140 and a InGaP base layer 1145 in one step in the same reactor. The first crystalline layer is lattice-mismatched to the crystalline semiconductor substrate. A majority of defects arising at a surface of the first crystalline layer nearest the crystalline semiconductor substrate terminate within the respective top openings.

9. A top protective layer 2115, e.g., a layer of SiN$_x$ with a thickness of between 50 nm and 500 nm, preferably about 200 nm is deposited on the top side of the structure by CVD. The bottom protective layer 2115' is removed from the backside of the substrate by a dry etch and a wet clean with, e.g., piranha and HF dip.

10. A bottom metal 1155' is formed on the back side of the structure by e-beam deposition or sputtering. The bottom metal may include a suitable composition for forming a low resistance contact. For example, the bottom metal may include or consist of an Au/Ni alloy, having a thickness selected from a range of about 300 nm to about 1 μm, preferably about 500 nm.

11. The top protective layer 2115 is removed by, e.g., dry etching, and the top surface is cleaned with water. A top metal 1155 is deposited over the structure. The top metal may be a metal suitable for forming a low-resistance contact with the adjacent semiconductor material. A suitable metal is, for example, an Au/Ni alloy, with a thickness selected from a range of about 500 nm to about 1 μm. Contacts are patterned in the metal 1155 by photolithography and etch. Subsequently, an anneal with forming gas may be performed to improve the contacts. Forming gas is a mixture of up to 10% hydrogen in nitrogen; the anneal may be of sufficiently high temperature and duration to improve the contact, e.g., about 250° C. to 450° C., preferably about 400° C. for about 1 second to 5 minutes, preferably 1 minute in a rapid thermal annealing system. The anneal may also be performed in a conventional furnace for a longer duration.

The resulting structure has a top ART region 1110, i.e., a first solar cell or photovoltaic cell, disposed above the substrate 300. The first solar cell includes a first semiconductor material having a first lattice constant, i.e., the first crystalline layer. The first semiconductor material includes a first III-V compound, and the first solar cell has a first photovoltaic junction 1152 defined by the III-V compound. A second solar cell or photovoltaic cell is disposed below the first solar cell, e.g., defined in the substrate 300. The material of the second solar cell, e.g., silicon, has a second lattice constant mismatched with respect to the first semiconductor material. The second solar cell includes an emitter 1705 and a base 1710, with a second photovoltaic junction 2110 defined therebetween. A bottom ART region 1130, i.e., a third solar cell or photovoltaic cell, is disposed below the second solar cell and below the substrate. The third solar cell includes the second semiconductor material that is lattice-mismatched to the material of the second solar cell, e.g., a second III-V compound, and a photovoltaic junction 1152'.

The first solar cell has a first energy bandgap, e.g., less than 1.1 eV; in some embodiments, the first energy bandgap is less than about 0.8 eV. The second solar cell is disposed below the first solar cell and has a second energy bandgap greater than the first energy bandgap and approximately equal to a bandgap of silicon, i.e., 1.1 eV. The third solar cell is disposed below the second solar cell and has a third energy greater than the second energy bandgap, e.g., greater than 1.1 eV. In some embodiments, the third energy bandgap is greater than about 1.6 eV.

Figure 22:
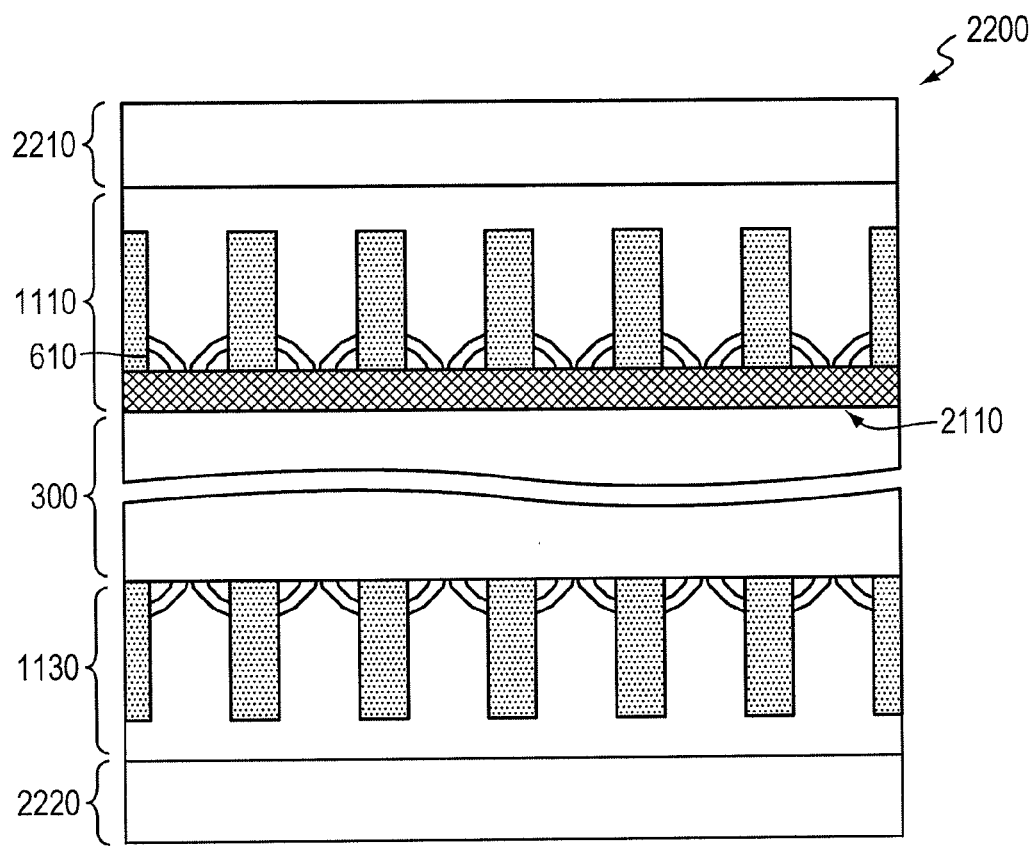
FIG. 22 is a schematic diagram illustrating a five-junction InGaP/GaAs/Si/GaAsSb/InGaAs solar cell.

FIG. 22 illustrates a five-junction InGaP/GaAs/Si/GaAsSb/InGaAs solar cell 2200. Similarly to the embodiment illustrated in FIG. 11, this embodiment uses ART on both sides of a Si substrate 300 that has a photovoltaic junction 2110 defined therein. ART is used to trap defects to facilitate forming two solar cells, i.e., a top ART cell 1110 containing GaAs and a bottom ART cell 1130 containing GaAsSb, above the top and bottom surfaces of the Si substrate, respectively. A fourth photovoltaic cell 2210, e.g., an InGaP cell, is formed over the top ART GaAs cell, and a fifth photovoltaic cell 2220, e.g., an InGaAs cell, is formed over the GaAsSb cell. The crystal lattices for these latter cell pairs are substantially matched to adjacent materials and thereby avoid lattice-mismatch defects.

Figure 23:
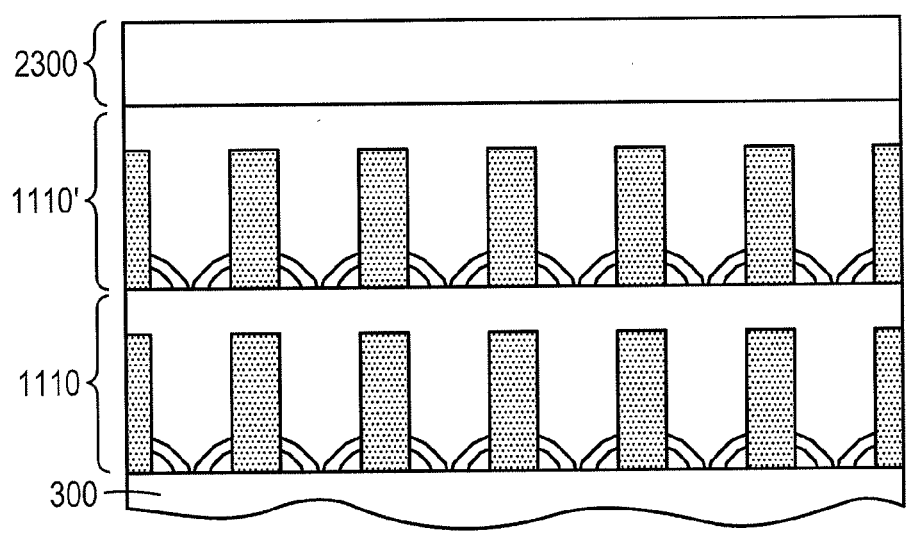
FIG. 23 is a schematic diagram illustrating a three-junction InGaP/GaAs/InGaAs solar cell disposed over a Si substrate.

FIG. 23 illustrates an embodiment in which ART is first used to form a first top ART region 1110 that traps defects arising from lattice-mismatch for an InGaAs solar cell, which has a nominal bandgap of about 0.7 eV, grown above a silicon substrate 300. Then a second top ART region 1110' is formed over the first top ART region. The second top ART region includes a GaAs solar cell with a nominal bandgap of about 1.4 eV. Finally, a third solar cell 2300, including, e.g., n- and p-type InGaP, which has a nominal bandgap of about 1.8 eV, is grown above the second top ART region 1110', i.e., over the GaAs cell.

Figure 24:
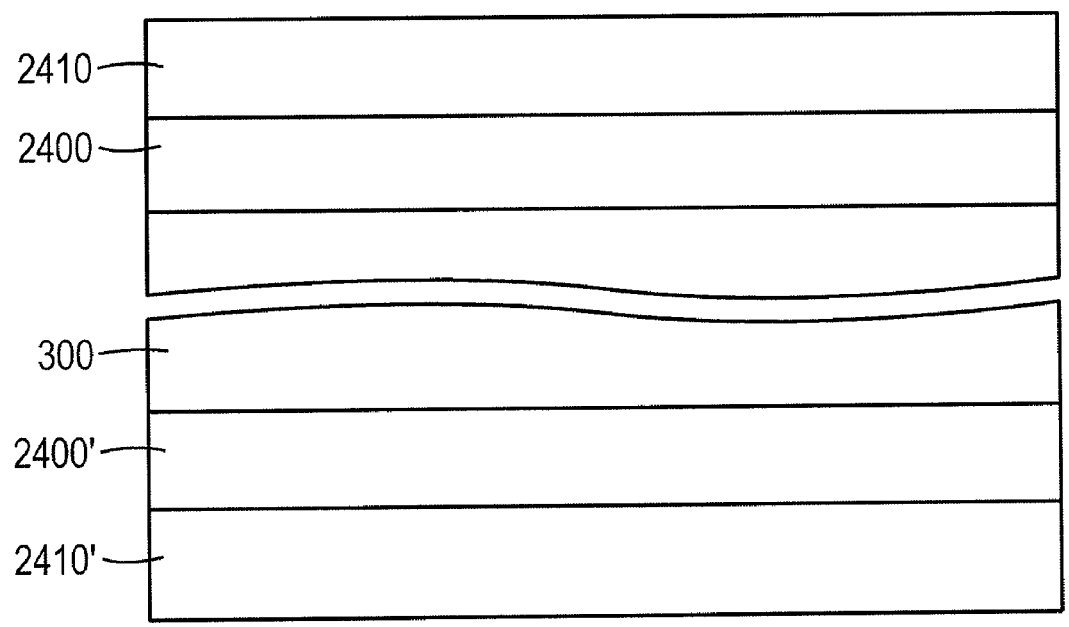
FIG. 24 is a schematic diagram illustrating a three-junction InGaP/Si/InGaAs solar cell incorporating InGaP graded buffer layers on both sides of a Si substrate.

As discussed above, fabrication of solar cell embodiments that have junctions on both sides of a substrate without using ART techniques is possible. While ART provides an excellent way to reduce defects arising from lattice-mismatch between different materials, those of skill in the art will, in view of the disclosure herein, understand how to use other techniques that have either suitable or tolerable defect levels. For example, FIG. 24 shows the use of compositionally graded top and bottom buffer layers 2400, 2400', e.g., InGaP graded buffer layers formed on both sides of a substrate 300, e.g., a Si substrate, to facilitate a three-junction InGaP/Si/InGaAs solar cell. Illustratively the graded buffer layers 2400, 2400' each start with GaP formed adjacent the Si substrate (because GaP has a lattice constant that approximately matches that of Si). On a top side of the Si substrate, the graded buffer layer 2400 includes GaP and is graded to a layer of (approximately) $In_{0.5}Ga_{0.5}P$, and on a bottom side, the graded buffer layer 2400' includes GaP graded to an $In_xGa_{1-x}P$ layer that has a lattice constant matched, at least approximately, to the lattice constant of InGaAs. In the illustrated structure, the graded buffer layers 2400, 2400' are disposed between the first (InGaP top photovoltaic cell 2410) and second (Si substrate 300 photovoltaic cell) photovoltaic cells, and the second (Si substrate 300) and third (InGaAs bottom photovoltaic cell 2410') photovoltaic cells, respectively. Those of skill in the art understand the criteria for the selection of materials and other parameters such as thicknesses and growth conditions for the graded buffer layers.

Figure 25:
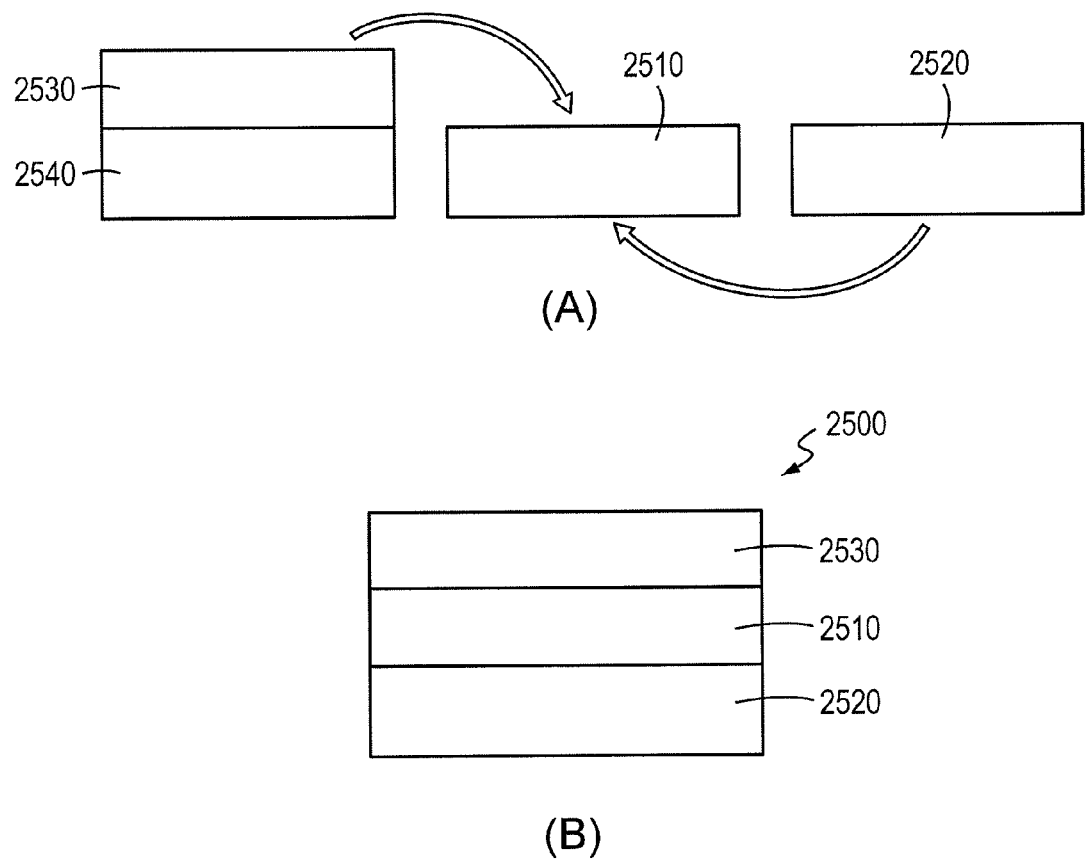
FIGS. 25*a*-25*b* are schematic diagrams illustrating the use of wafer bonding or layer transfer to create a three-junction InGaP/Si Ge solar cell.
Figure 26:
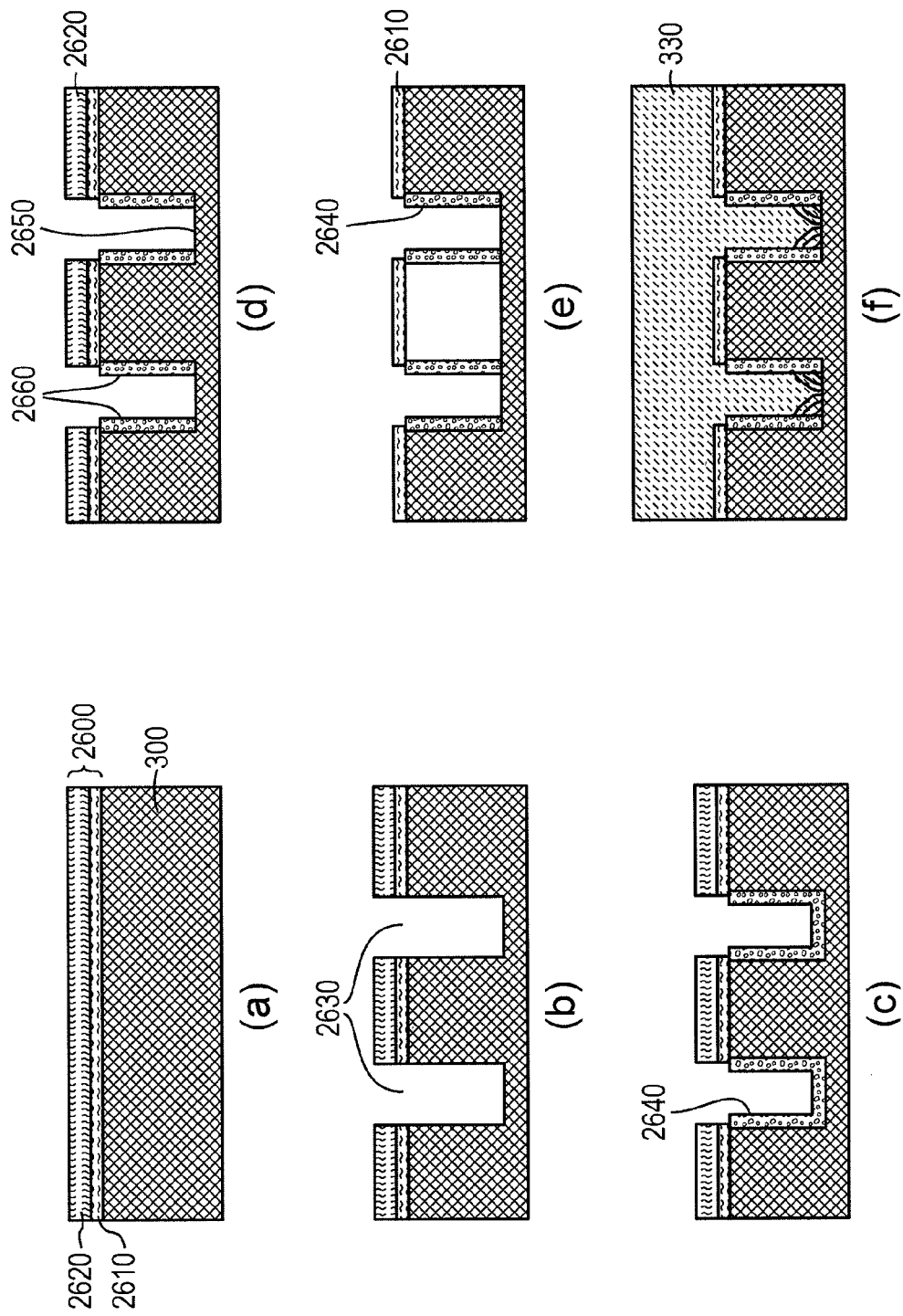
FIGS. 26*a*-26*f* are a series of schematic diagrams illustrating an alternative method for forming an ART structure.

Those of skill in the art also understand how to apply techniques other than ART and graded buffers, such as wafer bonding, selective epitaxy on mesas, or direct epitaxy of lattice-mismatched materials, to facilitate creating solar cell junctions on both sides of a substrate. For example, FIGS. 25a and 25b illustrate an embodiment that uses wafer bonding or layer transfer to create a three-junction InGaP/Si/Ge solar cell 2500. A single-junction Si solar cell 2510 (i.e., a first active photonic device layer) and a single-junction Ge solar cell 2520 (i.e., a second active photonic device layer) are fabricated directly on Si and Ge substrates, respectively, by the implantation of appropriate dopants. An InGaP solar cell 2530 is formed on a GaAs substrate 2540. Wafer bonding techniques are then used to combine the Si, Ge, and InGaP solar cells 2510, 2520, and 2530 into a multi-junction solar cell 2500, with the GaAs substrate 2540 being removed, for example, by wet etching. For example, the first active photonic device layer may be formed in InGaP 2530 and bonded to a top surface of the Si substrate 2510 (including a solar cell). A second active photonic device layer maybe formed in Ge 2520 and bonded to a bottom surface of the Si substrate 2510. A third active photonic device layer may be defined by the Si substrate 2510. FIG. 25b illustrates an embodiment with a current path that flows from the InGaP cell 2530 through the Si cell 2510 and into the Ge cell 2520.

In an alternative embodiment that does not require current matching between the three cells, a dielectric layer may be included between each of the cells, in which case separate electrodes are used for each of the three cells.

In some embodiments, at least a portion of an ART region may be formed in, rather than over, a substrate. An exemplary process is illustrated in FIGS. 26a-26f. A substrate 300, e.g., a Si wafer, is provided. A masking layer 2600 is formed over the substrate 300. The masking layer 2600 may include a thin layer of silicon dioxide 2610 and a thicker layer of silicon nitride 2620 disposed thereover. The silicon dioxide layer may about 100 nm thick and the silicon nitride layer may be about 1000 nm. The silicon dioxide layer is interposed between the silicon nitride layer and the substrate to reduce cracking of the nitride layer. The masking layer is patterned by a photolithographic patterning step, and openings 2630 are dry etched through the masking layer 2600 and into the substrate 300. The openings 2630 may be, e.g., trenches. The trench width may range from 20 nm to 20 µm and the depth is selected such that the trench aspect ratio (the ratio of the depth to the width) is $\geq 1$. A second silicon dioxide layer 2640 is conformally deposited over the masking layer 2600 and along the sidewalls of the openings 2630 or grown along the sidewalls of the openings 2630. A dry etch of the second silicon dioxide layer 2640 is performed, removing the second dioxide layer 2640 from the silicon nitride 2620 and from the bottom portions 2650 of the openings, and leaving the second silicon dioxide layer 2640 on the sidewalls 2660 of the openings. A thin layer, about between 10 and 100 nm, optimally 25 nm, of silicon dioxide may be grown over the silicon dioxide portions 2620 and the exposed bottom portions of the openings, and subsequently removed by a dip in HF. This thin silicon dioxide layer is grown and stripped to clean the surface of the bottom of the trench, thereby removing damage and carbon compounds left over after the trench dry etch. The resulting structure includes openings 2630 defined in the substrate 300, with silicon dioxide layers 2610, 2640 disposed over the sidewalls of the openings and over the top surface of the substrate 300. This configuration provides an exposed crystalline surface suitable for epitaxial growth (i.e., the exposed substrate material in the bottom portions of the openings) and openings lined with a dielectric material, suitable for trapping defects by ART in lattice-mismatched crystalline material formed in the openings. Subsequently, lattice-mismatched material 330 may be formed in the openings, and used to form the solar-cell structures described above.

The invention may be embodied in other specific forms without departing from the spirit or essential characteristics thereof. The foregoing embodiments are therefore to be considered in all respects illustrative rather than limiting on the invention described herein.

What is claimed is:

1. A structure comprising:
   a first photovoltaic sub-cell including a first semiconductor material having a first lattice constant and a first bandgap energy;
   a second photovoltaic sub-cell including a second semiconductor material having a second lattice constant different from the first lattice constant and a second bandgap energy lower than the first bandgap energy;
   a defect-trapping layer disposed between the first and second photovoltaic sub-cells, the defect-trapping layer including a crystalline material, the crystalline material having a third bandgap energy higher than the second bandgap energy; and
   a non-crystalline material having at least one opening, the crystalline material and the second photovoltaic sub-cell being wholly disposed in the at least one opening, the crystalline material comprising defects terminating at the non-crystalline material.

2. The structure of claim 1 wherein the second semiconductor material comprises a III-V compound, and the second photovoltaic sub-cell comprises a photovoltaic junction defined by the III-V compound.

3. The structure of claim 1 wherein the first photovoltaic sub-cell comprises a photovoltaic junction defined in a substrate, the second photovoltaic sub-cell being above the substrate.

4. The structure of claim 1 wherein the second photovoltaic sub-cell comprises a first III-V compound, the first photovoltaic sub-cell comprises silicon.

5. The structure of claim 3 wherein the substrate comprises silicon.

6. A multi-junction solar cell device comprising:
   a first solar sub-cell comprising a first non-Si photovoltaic junction, the first solar sub-cell comprising a first defect in a first crystalline material, the first defect terminating at a first dielectric sidewall of a first dielectric material, the first solar sub-cell having an uppermost surface and a lowermost surface, the uppermost surface of the first solar sub-cell being opposite the lowermost surface of the first solar sub-cell;

a second solar sub-cell disposed below the first solar sub-cell and comprising a Si photovoltaic junction, the second solar sub-cell having an uppermost surface and a lowermost surface, the uppermost surface of the second solar sub-cell being opposite the lowermost surface of the second solar sub-cell, the lowermost surface of the first solar sub-cell being proximate the uppermost surface of the second solar sub-cell; and a third solar sub-cell disposed below the second solar sub-cell and comprising a second non-Si photovoltaic junction, the third solar sub-cell comprising a second defect in a second crystalline material, the second defect terminating at a second dielectric sidewall of a second dielectric material, the third solar sub-cell having an uppermost surface and a lowermost surface, the uppermost surface of the third solar sub-cell being opposite the lowermost surface of the third solar sub-cell, the uppermost surface of the third solar sub-cell being proximate the lowermost surface of the second solar sub-cell, wherein at least one of (i) a distance of the uppermost surface of the first solar sub-cell from the uppermost surface of the second solar sub-cell is equal to or less than a distance of an uppermost surface of the first dielectric material from the uppermost surface of the second solar sub-cell, and (ii) a distance of the lowermost surface of the third solar sub-cell from the lowermost surface of the second solar sub-cell is equal to or less than a distance of a lowermost surface of the second dielectric material from the lowermost surface of the second solar sub-cell.

7. A multi-junction solar cell device comprising:

a first solar sub-cell having a first energy bandgap;

a first dielectric layer having at least one first opening, the first solar sub-cell being wholly disposed in the at least one first opening;

a second solar sub-cell formed below the first solar sub-cell and having a second energy bandgap greater than the first energy bandgap and approximately equal to 1.1 eV;

a third solar sub-cell formed below the second solar sub-cell and having a third energy bandgap greater than the second energy bandgap; and a second dielectric layer having at least one second opening, the third solar sub-cell being wholly disposed in the at least one second opening.

8. The multi-junction solar cell device of claim 7, wherein the first energy bandgap is less than 1.1 eV and the third energy bandgap is greater than 1.1 eV.

9. The multi-junction solar cell device of claim 8 wherein the first energy bandgap is less than about 0.8 eV.

10. The multi-junction solar cell device of claim 7 wherein the second bandgap is selected from a range of about 1.0 eV to about 1.2 eV.

11. The multi-junction solar cell device of claim 7 wherein the third energy bandgap is greater than about 1.6 eV.

\* \* \* \* \*